(12) United States Patent
Otani et al.

(10) Patent No.: US 8,426,937 B2
(45) Date of Patent: Apr. 23, 2013

(54) LIGHT SENSOR AND DISPLAY

(75) Inventors: Natsuki Otani, Kanagawa (JP);
Tsutomu Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 98 days.

(21) Appl. No.: 12/324,520

(22) Filed: Nov. 26, 2008

(65) Prior Publication Data

US 2009/0146067 A1    Jun. 11, 2009

(30) Foreign Application Priority Data

Dec. 11, 2007 (JP) ................................. 2007-319141
Mar. 4, 2008 (JP) ................................. 2008-052811

(51) Int. Cl.
*H01L 27/146* (2006.01)
(52) U.S. Cl.
USPC ......... 257/444; 257/59; 250/206; 250/370.01
(58) Field of Classification Search .................. 257/444, 257/59; 250/206, 370.01
See application file for complete search history.

(56) References Cited

U.S. PATENT DOCUMENTS

2008/0002073 A1* 1/2008 Hwan Moon et al. .......... 349/38
2008/0074592 A1* 3/2008 Araki et al. .................... 349/114

FOREIGN PATENT DOCUMENTS

| JP | B 45-036051 | 11/1970 |
| JP | 07-202250 | 8/1995 |
| JP | 09-260630 | 3/1997 |
| JP | 2007-018458 | 1/2007 |

* cited by examiner

*Primary Examiner* — Kimberly Rizkallah
*Assistant Examiner* — Timor Karimy
(74) *Attorney, Agent, or Firm* — Robert J. Depke; The Chicago Technology Law Group, LLC

(57) ABSTRACT

A light sensor includes a control electrode formed on a substrate and having two edges, and a semiconductor film formed opposite the control electrode with an insulating film interposed therebetween, and including a photoactive layer and electrode regions located in a pair on opposite sides of the photoactive layer. The photoactive layer is arranged in an area that overlaps the control electrode. At least one of the paired electrode regions overlaps proximal one of the edges of the control electrode, and on and along the proximal edge, the at least one electrode region has a length shorter than that of the photoactive layer in a direction along the proximal edge of the control electrode.

5 Claims, 18 Drawing Sheets

F I G . 2
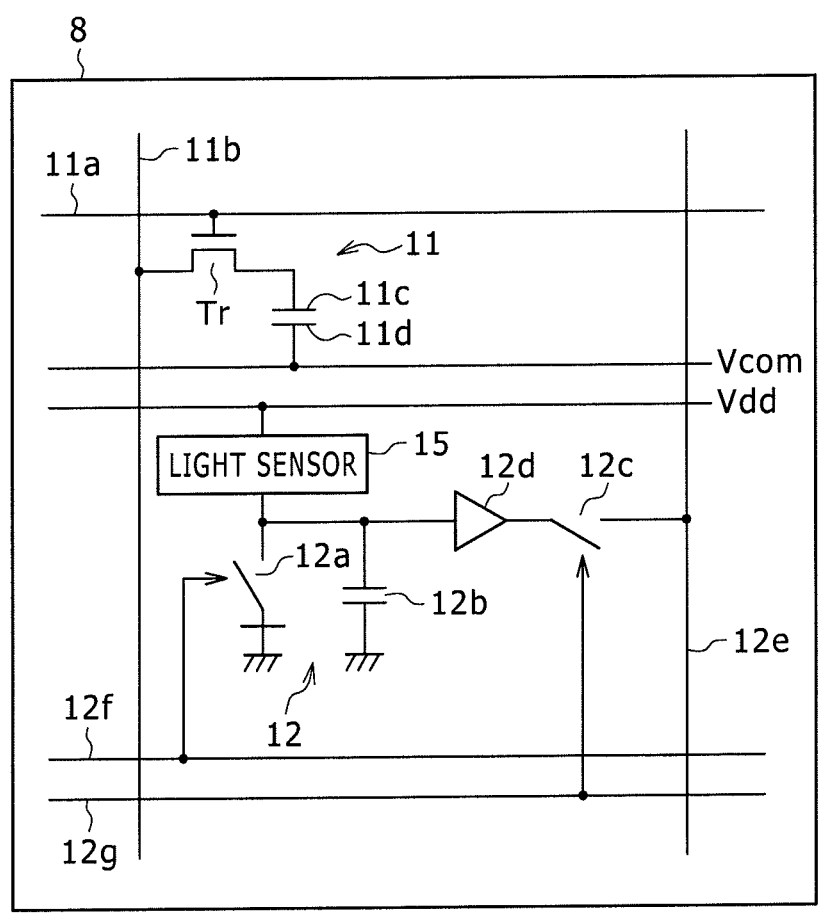

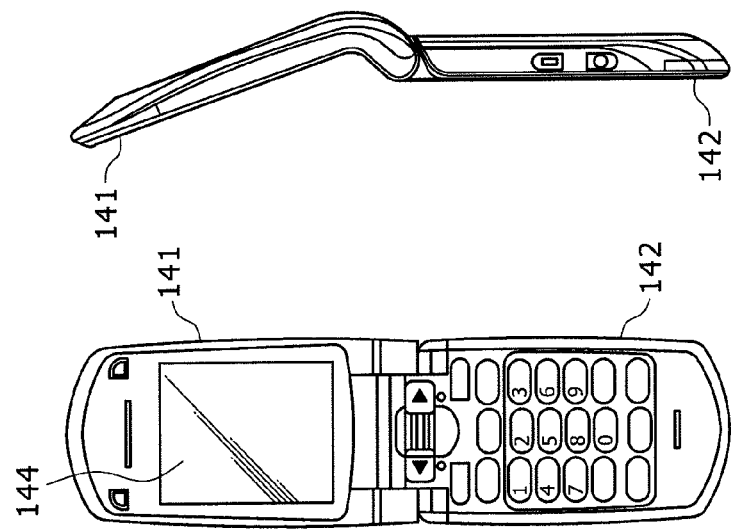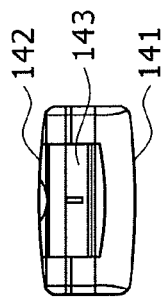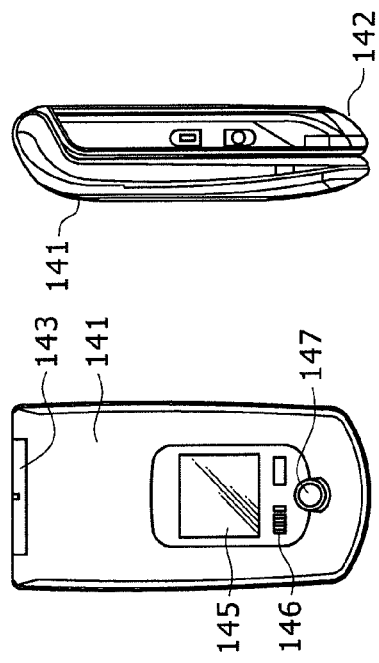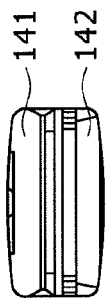

LIGHT SENSOR AND DISPLAY

CROSS REFERENCES TO RELATED APPLICATIONS

The present invention contains subject matter related to Japanese Patent Applications JP 2007-319141 and JP 2008-052811 filed in the Japan Patent Office on Dec. 11, 2007 and Mar. 4, 2008, respectively, the entire contents of which being incorporated herein by reference.

BACKGROUND OF THE INVENTION

1. Field of the Invention

This invention relates to light sensor making use of a semiconductor in the form of a thin film (hereinafter referred to as "a semiconductor film") and also to a display equipped with a number of such light sensors.

2. Description of the Related Art

Nowadays, displays each of which is equipped with light sensors are known. In a liquid crystal display, for example, thin-film transistors (TFTs) are used as switching devices for controlling the drive of pixels. There is known a display provided with such thin-film transistors and light sensors formed on the same substrate as the thin-film transistors by a similar fabrication process as that of the thin-film transistors (see, for example, Japanese Patent Laid-Open No. 2007-18458).

FIG. 24 is a plan view illustrating the construction of an existing light sensor 80, FIG. 25 is a cross-sectional view illustrating the construction of the light sensor 80. The illustrated light sensor 80 has a similar structure as an n-channel MOS (metal oxide semiconductor) transistor. In this light sensor 80, a control electrode 82 is formed like a strip on an upper surface of a substrate 81. Covering the control electrode 82, a first insulating film 83 is formed as a stacked layer. The first insulating film 83 is made up of a light-transmitting, insulating material. On an upper surface of the first insulating film 83, a semiconductor film 84 is formed. The semiconductor film 84 is roughly divided into a photoactive layer 85 and a pair of electrode regions 86, 87. The photoactive layer 85 acts to produce electron-hole pairs as a source of a photoelectric current when light enters the photoactive layer 85. The photoactive layer 85 is arranged within an area that overlaps the control electrode 82 as viewed in a plan.

The paired electrode regions 86, 87 are formed by introducing an impurity into the semiconductor layer 84 on opposite sides of the photoactive layer 85. Of the paired electrode regions 86, 87, one of them, that is, the electrode region 86 is arranged as a source region, while the other electrode region 87 is arranged as a drain region. The source region 86 and drain region 87 are both formed as rectangles having the same area. The source region 86 is divided into a low concentration region 86L, in which the impurity has been introduced at a relatively low concentration, and a high concentration region 86H, in which the impurity has been introduced at a relatively high concentration. The low concentration region 86L is located adjacent the photoactive layer 85. Similarly, the drain region 87 is divided into a low concentration region 87L, in which the impurity has been introduced at a relatively low concentration, and a high concentration region 87H, in which the impurity has been introduced at a relatively high concentration. The low concentration region 87L is located adjacent the photoactive layer 85.

On the upper surface of the first insulating film 83, a second insulating film 88 is formed as a stacked layer such that the second insulating film 88 covers the semiconductor film 84. The second insulating film 88 is made up of a light transmitting, insulating material. Through the second insulating film 88, plural contact holes 89 are formed to expose parts of the high concentration region 86H of the source region on 86, and further, plural contact holes 90 are formed to expose parts of the high concentration region 87H of the source region on 87. The source-side contact holes 89 are filled with the conductor material of a first conductor 91, while the drain-side contact holes 90 are filled with the conductor material of a second conductor 92. On an upper surface of the second insulating film 88, a planarizing film 93 is formed as a stacked layer, covering the respective conductors 91, 92. The planarizing film 93 is made up of a light-transmitting, insulating material.

In the light sensor 80 of the above-described construction, the incidence of light into the photoactive layer 85 in the semiconductor film 84 through the planarizing film 93, the second insulating film 88, etc. results in the production of electron-hole pairs in the photoactive layer 85 so that a photoelectric current is produced. This photoelectric current is read as a reception signal from the light sensor to the outside of the sensor.

SUMMARY OF THE INVENTION

As the photoelectric current produced in the light sensor 80 making use of the semiconductor film 84 is weak in general, the provision of the light sensor 80 with higher sensitivity needs to read the photoelectric current with high efficiency. For the high-efficient reading of the photoelectric current, it is effective to decrease the parasitic capacitance inside the sensor. Major factors that determine the parasitic capacitance inside the sensor are the mutually-facing area of the control electrode 82 and the source region 86 (the low concentration region 86L), which are facing each other via the first insulating film 83, and the mutually-facing area of the control electrode 82 and the drain region 87 (the low concentration region 87L), which are facing each other via the first insulating film 83. To decrease the parasitic capacitance inside the sensor, it is hence necessary to reduce the area of the semiconductor film 84. However, a reduction in the area of the semiconductor film 84 makes the area of the photoactive layer 85 narrower, leading to a reduction in the photoelectric current to be produced inside the sensor.

With a view to resolving the above-described problem, it is desirable to provide a light sensor having an internal parasitic capacitance decreased without lowering a photoelectric current to be produced inside the sensor, and a display equipped with a number of such light sensors.

In one embodiment of the present invention, there is thus provided a light sensor provided with: a control electrode formed on a substrate and having two edges; and a semiconductor film formed opposite the control electrode with an insulating film interposed therebetween, and including a photoactive layer and electrode regions located in a pair on opposite sides of the photoactive layer; wherein the photoactive layer is arranged in an area that overlaps the control electrode, and at least one of the paired electrode regions overlaps proximal one of the edges of the control electrode, and on and along the proximal edge, the at least one electrode region has a length shorter than that of the photoactive layer in a direction along the proximal edge of the control electrode.

Concerning the at least one of the paired electrode regions located on the opposite sides of the photoactive layer, respectively, in the light sensor according to the embodiment of the present invention, the length of the electrode section that overlaps the proximal side edge of the control electrode is designed shorter than that of the photoactive layer in the direction along the proximal side edge of the control electrode. This design has made it possible to reduce the mutually-facing area of the at least one electrode section and the control electrode without reducing the area of the photoactive layer.

According to the light sensor of the present embodiment, the sensor can be provided with a decreased internal parasitic capacitance without lowering a photoelectric current to be produced inside the sensor. Accordingly, a photoelectric current can be read with high efficiency from the light sensor.

According to another embodiment of the present invention, there is also provided a display provided on a substrate with pixel elements and light sensors as defined above. Owing to the above-described advantage of the light sensors, this display makes it possible, for example, to input coordinates in a display area by a finger, a stylus pen or the like, to capture an object located close to a display surface (screen) of a display panel, or to detect the brightness of an environment in which the display panel is installed.

BRIEF DESCRIPTION OF THE DRAWINGS

FIG. 2 is diagram illustrating a circuit construction in a display region of a display panel;

FIG. 23A is a front view of a cellular phone as a fifth application example in an opened state, FIG. 23B is a side view of the cellular phone in the opened state, FIG. 23C is a front view of the cellular phone in a closed state, FIG. 23D is a left side view of the cellular phone in the closed state, FIG. 23E is a right side view of the cellular phone in the closed state, FIG. 23F is a top view of the cellular phone in the closed state, and FIG. 23G is a bottom view of the cellular phone in the closed state;

DETAILED DESCRIPTION OF THE PREFERRED EMBODIMENTS

Specific embodiments of the present invention will hereinafter be described in detail with reference to the drawings. It is, however, to be noted that the technical scope of the present invention shall not be limited to the embodiments to be described hereinafter but can also encompass embodiments with various modifications or improvements within a range where specific advantageous effect or effects available from the elements of the present invention or combinations thereof can be brought about.

<Overall Construction of Display>

Figure 1:
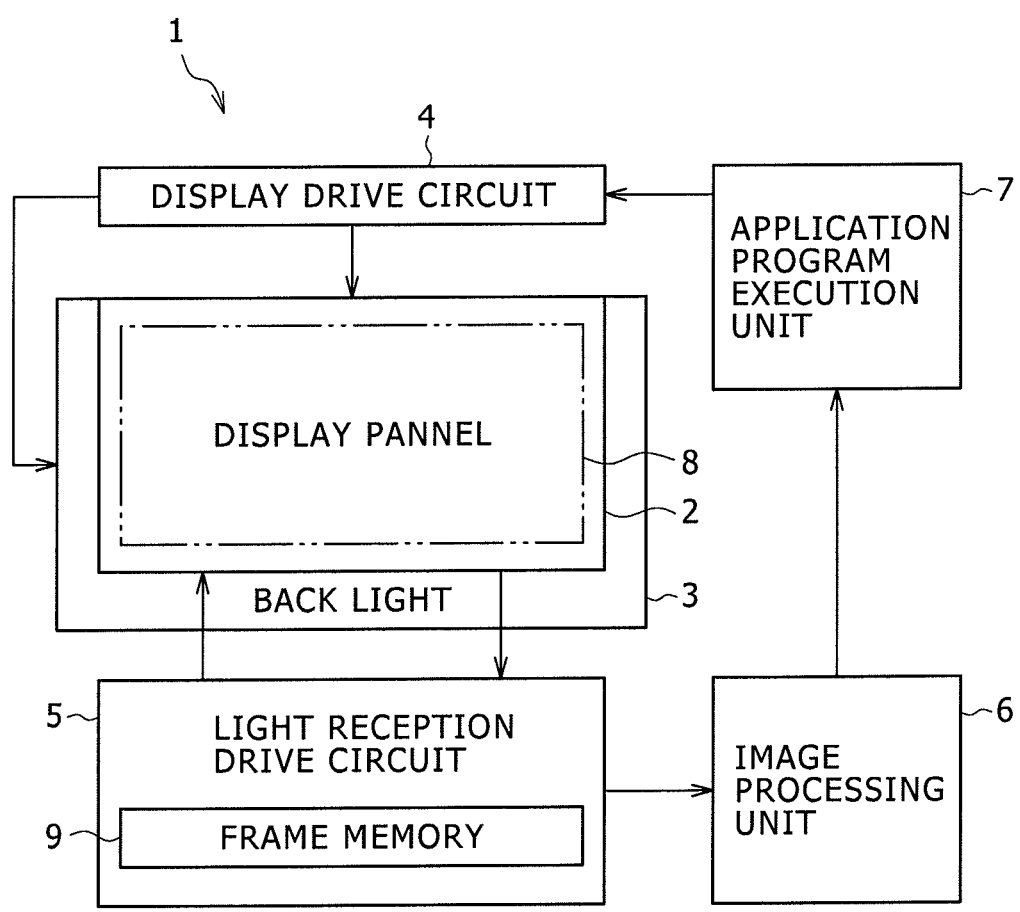
FIG. 1 is a block diagram illustrating the overall construction of a display according to an embodiment of the present invention.

Referring to FIG. 1, a display 1 is provided with a display panel 2, a backlight 3, a display drive circuit 4, a light reception drive circuit 5, an image processing unit 6, and an application program execution unit 7.

The display 1 is constructed of an LCD (Liquid Crystal Display) making use of a liquid crystal panel as the display panel 2. The display panel 2 has a display area 8 for displaying an image. In the display area 8 of the display panel 2, plural pixels are arranged in a matrix over the entire area. The display panel 2 displays a predetermined image such as a picture or characters while performing a line-sequential operation. The display area 8 is also provided with light sensors for detecting an object which is brought into contact with or close to the display surface (screen). These light sensors make it possible, for example, to input coordinates in the display area by a finger, a stylus pen or the like, to capture an object located close to the display surface (screen) of the display panel, or to detect the brightness of the environment in which the display panel is installed.

The backlight 3 serves as a light source for displaying an image on the display panel 2. The backlight 3 is constructed, for example, such that plural light-emitting diodes are arrayed in a plane. The backlight 3 performs high-speed on/off control of the light-emitting diodes at a predetermined timing synchronized with the operation timing of the display panel 2.

The display drive circuit 4 performs each drive (the drive of each light-sequential operation) of the display panel 2 to display an image based on the corresponding display data on the display panel 2.

The light reception drive circuit 5 performs each drive (the drive of each line-sequential operation) of the display panel 2 to acquire reception data (to detect the contact or adjacency of an object) at the display panel 2. The light reception drive circuit 5 has a frame memory 9. Reception data at respective pixels are once accumulated in a memory, for example, as a frame in a memory, and are then outputted to the image processing unit 6.

The image processing unit 6 performs a predetermined image processing (arithmetic processing) based on the reception data outputted from the light reception drive circuit 5, and detects and acquires information (position coordinate data, data on the shape and size of the object, etc.) on the object that has come to contact with or has come close to the display panel 2.

Based on the results of the detection by the image processing unit 6, the application program execution unit 7 performs a processing corresponding to a predetermined application software. As the processing, it is possible to mention, for example, to include the position coordinates of the object as detected at the image processing unit 6 and to display them on the display panel 2. The display data produced at the application program execution unit 7 are fed to the display drive circuit 4.

<Circuit Construction of Display Area>

With reference to FIG. 2, a description will next be made of the circuit construction at the display area 8 of the display panel 2. As illustrated in the figure, the display area 8 is provided with plural pixel elements 11 and plural sensor elements 12. The plural pixel elements 11 are arranged in a matrix over the entirety of the display area 8, and the plural sensor elements 12 are also arranged in a matrix over the entirety of the display area 8. Described specifically, the pixel elements 11 and sensor elements 12 are arranged such that as depicted in FIG. 2 by way of example, they alternately line up in arrays in the vertical scanning direction of the display panel 2. Concerning the arrangement of the sensor elements 12, they may be arranged in a 1:1 relation with sub-pixels corresponding to the respective color components of red (R), green (G) and blue (B) or in a 1:1 relation with main pixels composed of combinations of three sub-pixels of R, G and B; or one sensor element 12 may be arranged for plural main pixels. Further, the sensor elements 12 may be arranged only at a limited part (predetermined position) of the display area 8 instead of the entirety of the display area 8.

The pixel elements 11 are arranged in the display area 8 at respective intersections between plural scan lines 11a laid in the horizontal direction and plural signal lines 11b laid in the vertical direction. Each pixel element 11 is provided with a thin film transistor (TFT) Tr which serves, for example, as a pixel-driving switching device.

The thin film transistor Tr is connected at a gate thereof to the scan line 11a, is connected at one of a source and drain thereof to the signal line 11b, and is connected at the other one of the source and drain thereof to a pixel electrode 11c. Each pixel elements 11 is also provided with a common electrode 11d such that a common potential Vcom is applied to all the pixel elements 11.

Based on a drive signal fed through the scan line 11a, the thin film transistor Tr is turned on or off. When the thin film transistor Tr is in an ON state, a pixel voltage is applied to the pixel electrode 11c based on a display signal fed from the signal line 11b, and by an electric field between the pixel electrode 11c and the common electrode 11d, a liquid crystal layer is driven.

On the other hand, each sensor element 12 is provided with a light sensor 15. The light sensor 15 is formed, for example, by using the same layer (the same step) as the thin film transistor Tr in the above-described pixel element 11. Described specifically, assuming that the pixel elements 11 are arranged, for example, on a transparent glass substrate, the light sensors 15 are also arranged together with the pixel elements 11 on the glass substrate. In this case, the pixel elements 11 are formed using thin film transistors, and these thin film transistors are arranged in arrays on the substrate. The substrate is, therefore, called "a TFT array substrate" or "a drive substrate." The display panel 2 is constructed by enclosing and holding a liquid crystal layer between the TFT array substrate and an opposite substrate (for example, a color filter substrate with a color filter layer formed thereon).

The circuit is designed to feed a power supply voltage Vdd to each light sensor 15. To the light sensor 15, a resetting switching element 12a and a capacitor (storage capacitor) 12b are connected. The light sensor 15 produces electron-hole pairs upon incidence of (exposure to) light and generates a photoelectric current proportional to the quantity of the light. This photoelectric current is read as a reception signal to the outside of the sensor. The reception signal (signal charge) of the light sensor 15 is accumulated in the capacitor 12b. The switching element 12a resets at a predetermined timing the reception signal accumulated in the capacitor 12b. At a timing that a reading switching element 12c is turned on, the reception signal accumulated in the capacitor 12b is fed (read) to a reception signal conductor 12e through a buffer amplifier 12d and is then outputted to the outside. The on/off operation of the resetting switching element 12a is controlled by a reset signal fed through a reset control line 12f. On the other hand, the on/off operation of the reading switching element 12c is controlled by a read signal fed through a read control line 12g.

First Embodiment

Figure 3:
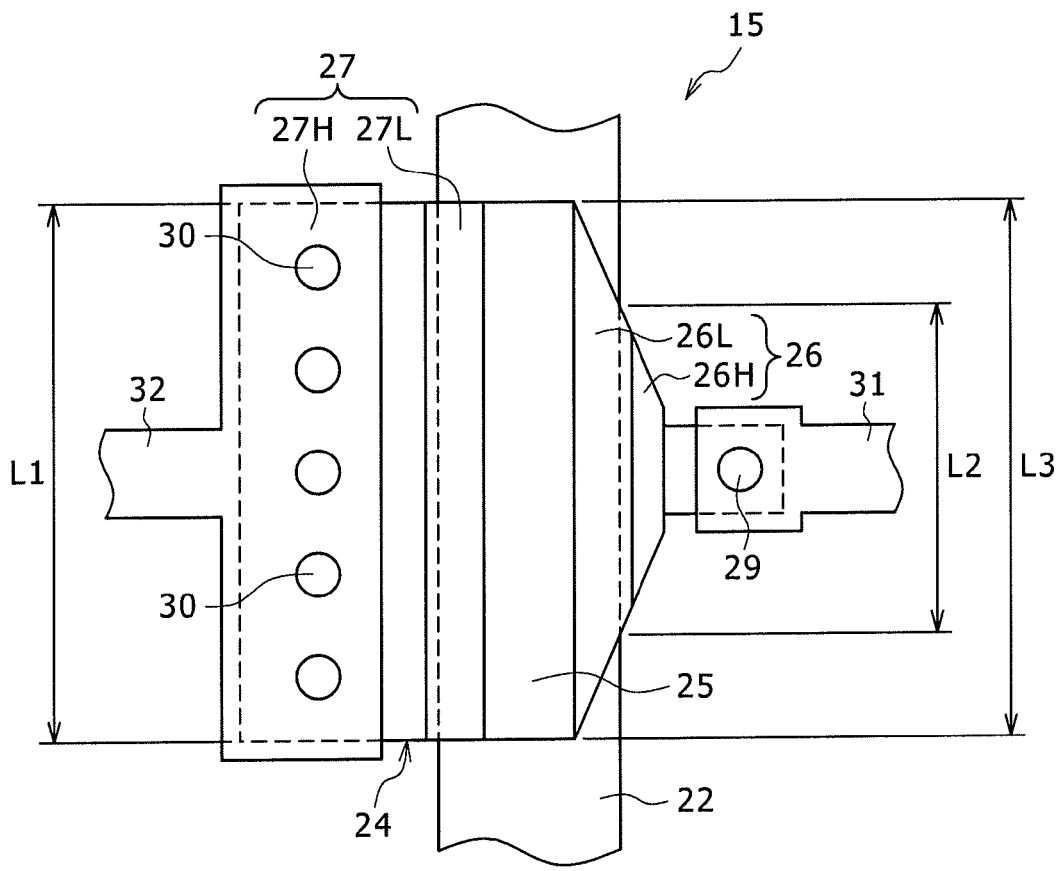
FIG. 3 is a plan view illustrating the construction of a light sensor according to a first embodiment of the present invention.
Figure 4:
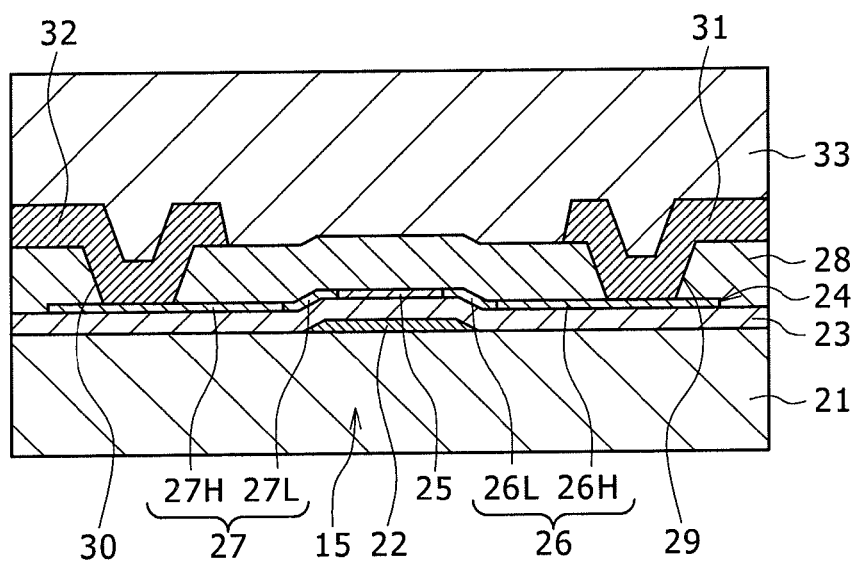
FIG. 4 is a cross-sectional view illustrating the construction of the light sensor according to the first embodiment of the present invention.

Referring to FIGS. 3 and 4, the construction of a light sensor 15 according to the first embodiment of the present invention will be described. The illustrated light sensor 15 has a similar structure as an n-channel MOS transistor. In this light sensor 15, a control electrode 22 is formed like a strip on an upper surface of a substrate 21. Covering the control electrode 22, a first insulating film 23 is formed as a stacked layer. The substrate 21 is made up of a substrate having light-transmitting properties, specifically, for example, a transparent glass substrate. The control electrode 22 corresponds to the gate electrode of the MOS transistor. To the control electrode 22, a predetermined voltage is applied through an unillustrated control conductor to control the drive of the light sensor 15. The control electrode 22 is made up of a light-reflecting, conductive material such as, for example, molybdenum or a high melting-point metal. The first insulating film 23 corresponds to the gate insulating film of the MOS transistor.

The first insulating film 23 is made up of a light-transmitting, insulating material (for example, silicon oxide, silicon nitride or the like). For the formation of the first insulating film 23, CVD (Chemical Vapor Deposition) process can be employed. On an upper surface of the first insulating film 23, a semiconductor film 24 is formed. The semiconductor film 24 is a thin film made up, for example, of polycrystalline silicon, and is formed on the first insulating film 23 such that it extends over the control electrode 22 in the direction of the channel length of the MOS transistor (the horizontal direction in the figure). The semiconductor film 24 can be formed, for example, by forming amorphous silicon on the first insulating film 23 and then irradiating an eximer laser to polycrystallize the silicon layer. The semiconductor film 24 is roughly divided into a photoactive layer 25 and a pair of electrode regions 26, 27.

The photoactive layer 25 corresponds to the channel of the MOS transistor, and has photoelectric conversion function. The photoactive layer 25 produces electron-hole pairs as a source of a photoelectric current when light enters the photoactive layer 25. As viewed in a plan, the photoactive layer 25 takes the form of a rectangle which extends in the direction of the length of the control electrode 22. The photoactive layer 25 is arranged within an area that overlaps the control electrode 22. In the direction of the channel length (the source-to-drain direction) of the MOS transistor, the dimension of the photoactive layer 25 is set smaller than that of the control electrode 22, and in the direction of the channel width (the direction perpendicular to the direction of the channel width) of the MOS transistor, the dimension of the photoactive layer 25 is also set smaller than that of the control electrode 22. The photoactive layer 25 is, therefore, arranged to be completely enclosed within the formation area of the control electrode 22.

The paired electrode regions 26, 27 are formed by introducing (implanting) an impurity into the semiconductor layer 24 on opposite sides of the photoactive layer 25, for example, while using an ion implantation system. The electrode regions 26, 27 are, both, N+ regions. Of the paired electrode regions 26, 27, one of them, that is, the electrode region 26 is arranged as a source region that forms a MOS transistor, while the other electrode region 27 is arranged as a drain region that forms the MOS transistor. In the semiconductor film 24 made of the polycrystalline silicon film, the source region 26 and drain region 27 can be formed, for example, as will be described next. After a silicon oxide film is formed to cover the polycrystalline silicon film, a resist is patterned onto the silicon oxide film by a photolithographic technology. Using an ion implantation system, an impurity is then introduced into the polycrystalline silicon film through openings in the resist to form the source region 26 and drain region 27. Subsequently, the substrate 21 is placed in an annealing oven to activate the impurity. After the resist is stripped off, a resist pattern is formed again. The polycrystalline silicon film and silicon oxide film are then patterned with a dry etcher.

The source region 26 is divided into a low concentration region 26L, in which the impurity has been introduced at a relatively low concentration, and a high concentration region 26H, in which the impurity has been introduced at a relatively high concentration. The low concentration region 26L is located adjacent the photoactive layer 25 in the direction of the channel length. The low concentration region 26L of the source region 26 is arranged such that it extends over a proximal side edge of the control electrode 22 in the direction of the channel length. Similarly, the drain region 27 is divided into a low concentration region 27L, in which the impurity has been introduced at a relatively low concentration, and a high concentration region 27H, in which the impurity has been introduced at a relatively high concentration. The low concentration region 27L is located adjacent the photoactive layer 25 in the direction of the channel length. The low concentration region 27L of the drain region 27 is arranged such that it extends over a proximal side edge of the control electrode 22 in the direction of the channel length. Such a transistor structure is also called the LDD (Lightly Doped Drain) structure. It is the object of the adoption of the LDD structure to reduce the drain electric field. On the other hand, the high concentration regions 26H,27H are arranged to convert the opposite end portions of the semiconductor film 24 into electrodes (source electrode, drain electrode). In this case, the side edges of the control electrode 22 serve as edges that define the ends of the control electrode 22 in the direction between the paired electrodes, one being the source region 26 and the other the drain region 27, (the source-to-drain direction).

On the upper surface of the first insulating film 23, a second insulating film 28 is formed as a stacked layer such that the second insulating film 28 covers the semiconductor film 24. The second insulating film 28 is made up of a light transmitting, insulating material (for example, silicon oxide, silicon nitride or the like). For the formation of the second insulating film 28, CVD (Chemical Vapor Deposition) process can be employed. Through the second insulating film 28, a single contact hole 29 is formed to expose the high concentration region 26H of the source region 26 at a part thereof, and further, plural (five in the illustrated embodiment) contact holes 30 are formed to expose the high concentration regions 27H of the drain region 27 at parts thereof. The respective contact holes 29, 30 can be formed through the second insulating film 28, for example, by forming a resist pattern on the second insulating film 28 by a photolithographic technology and then etching the second insulating film 28 through the resist pattern. The source-side contact holes 29 are filled with the conductor material of a first conductor 31, while the drain-side contact holes 30 are filled with the conductor material of a second conductor 32. As the conductor materials of the first conductor 31 and second conductor 32, aluminum can be used, for example. On an upper surface of the second insulating film 28, a planarizing film 33 is formed as a stacked layer, covering the respective conductors 31, 32. The planarizing film 33 is made up of a light-transmitting, organic, insulating material.

Now comparing the source region 26 of the semiconductor film 24 with the drain region 27 of the semiconductor film 24, the drain region 27 is formed in the shape of a rectangle while the source region 26 is formed in the shape of a trapezoid smaller than the drain region 27. Describing in further detail, the longer length of the rectangle that defines the drain region 27 has the same dimension as the length (longer dimension) of the photoactive layer 25. On the other hand, the lower side of the trapezoid that defines the source region 26 has the same dimension as the longer dimension of the photoactive layer 25, but the upper side of the trapezoid that defines the source region 26 has a dimension shorter than the longer dimension of the photoactive layer 25. The expression "the length of the photoactive layer 25" as used herein means the length of the photoactive layer 25 in a direction along the above-mentioned proximal side edge of the control electrode 25. As the photoactive layer 25 is formed in the shape of a vertically-long strip In FIG. 3, the length of the photoactive layer 25 is defined by the longer dimension of the photoactive layer 25. However, if the photoactive layer 25 is formed, for example, in the shape of a horizontally-long strip, the length of the photoactive layer 25 is defined by the shorter dimension of the photoactive layer 25.

With respect to the drain region 27, the length of the low concentration region 27L, which overlaps the proximal side edge of the control electrode 22, and the length of the photoactive layer 25 in the direction along the proximal side edge of the control electrode 22 (the length of a boundary portion between the low concentration region 27L and the photoactive layer 25 in this embodiment) are both set at the same length L1. As to the source region 26, on the other hand, the length L2 of the low concentration region 26L, which overlaps the proximal side edge of the control electrode 22, is shorter than the length L3 (L3=L1) of the photoactive layer 25 in the direction along the proximal side edge of the control electrode 22 (the length of a boundary portion between the low concentration region 26L and the photoactive layer 25 in this embodiment). In the embodiment illustrated in the figures, there is the dimensional relation of L3×0.65≈L2.

In the light sensor 15 of the above-described construction, the incidence of light into the photoactive layer 25 in the semiconductor film 24 through the planarizing film 33, the second insulating film 28, etc. results in the production of electron-hole pairs in the photoactive layer 25 so that a photoelectric current is produced. This photoelectric current is read as a reception signal from the light sensor to the outside of the sensor.

In the light sensor 15 according to the first embodiment of the present invention, the length L2 of the low concentration region 26L, which overlaps the proximal side edge of the control electrode 22, is made shorter than the length L3 of the photoactive layer 25 in the direction along the proximal side edge of the control electrode 22 by forming the source region 26 of the semiconductor film 24 in the shape of the trapezoid. Therefore, the mutually-facing area of the control electrode 22 and the source region 26 (low concentration region 26L) is smaller than that of the control electrode 22 and the drain region 27 (low concentration region 27L). Compared with the formation of the source region 26 in the shape of a rectangle like the drain region 27, the mutually-facing area of the control electrode 22 and the source region 26 hence becomes smaller, and the parasitic capacitance inside the sensor is reduced correspondingly. As the longer dimension of the photoactive layer 25 remains at the same value (L1=L3) on both the source side and the drain side, the region (area) of the photoactive layer 25 as the production source of electron-hole pairs remains as it is. Therefore, the photoelectric current produced inside the sensor is not lowered. As a result, the parasitic capacitance inside the sensor can be reduced without lowering the photoelectric current to be produced inside the sensor. It is, therefore, possible to efficiently read the photoelectric current as a reception signal of the light sensor 15.

In the above-described first embodiment, the mutually-facing area on the source side is made smaller than that on the drain side by forming the drain region 27 in the shape of the rectangle and the source region 26 in the shape of the trapezoid. Conversely, the mutually-facing area on the drain side may be made smaller than that on the source side by forming the drain region 27 in the shape of a trapezoid and the source region 26 in the shape of a rectangle.

Second Embodiment

Figure 5:
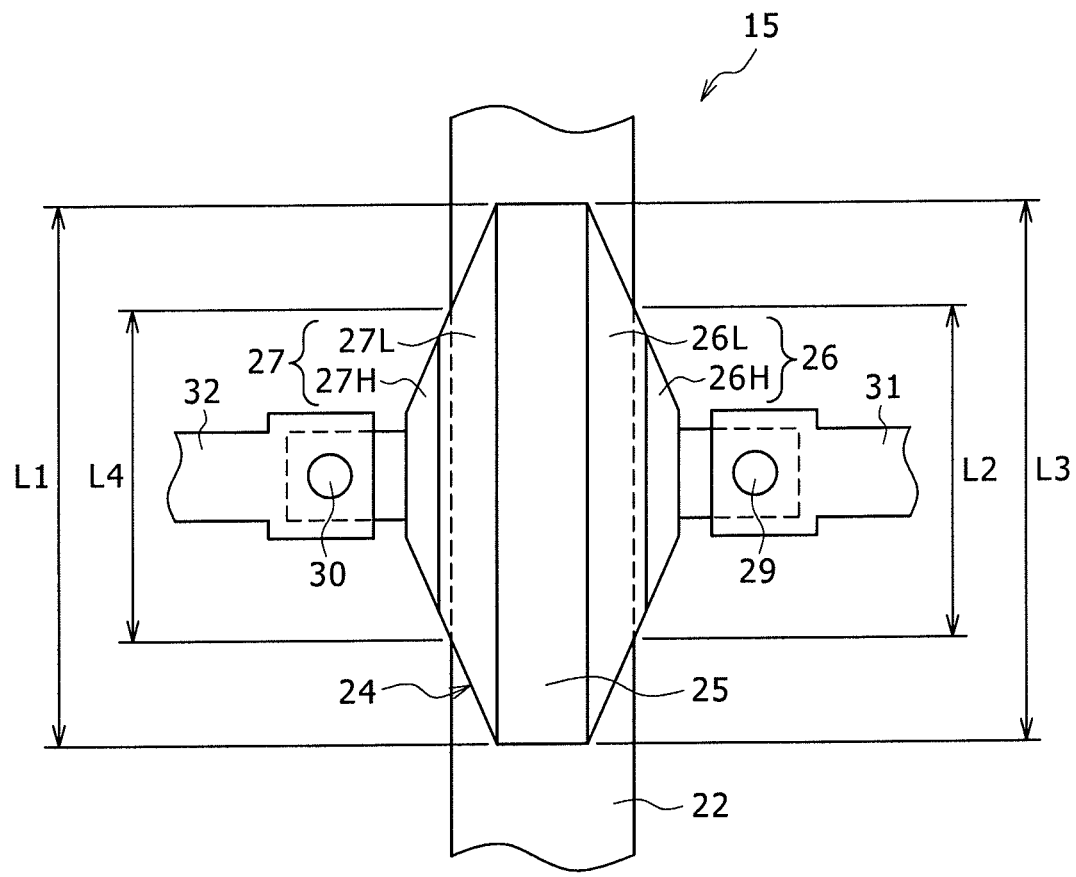
FIG. 5 is a plan view illustrating the construction of a light sensor according to a second embodiment of the present invention.

Referring next to FIG. 5, the construction of a light sensor 15 according to the second embodiment of the present invention will be described. In this second embodiment, the shape of a drain region 27 is different from the above-described first embodiment. Specifically, the shape of the drain region 27 is rectangular in the first embodiment, but in this second embodiment, the drain region 27 is formed in the shape of a similar trapezoid as a source region 26. With respect to the drain region 27, the length L4 of a low concentration region 27L which overlaps the proximal side edge of a control electrode 22 is shorter than the length L1 of a boundary portion between the low concentration region 27L and a photoactive layer 25.

In the light sensor 15 of the above-described construction, the length L2 of a low concentration region 26L, which overlaps the proximal side edge of the control electrode 22, is made shorter than the length L3 of the photoactive layer 25 in the direction along the proximal side edge of the control electrode 22 (the length of a boundary portion between the low concentration region 26L and the photoactive layer 25) by forming each of the source region 26 and drain region 27 of the semiconductor film 24 in the shape of the trapezoid. Compared with the first embodiment, the mutually-facing area of the control electrode 22 and the drain region 27 (low concentration region 27L) is therefore smaller, and the parasitic capacitance inside the sensor is reduced correspondingly. As the longer dimension of the photoactive layer 25 remains at the same value (L1=L3) on both the source side and the drain side, the region (area) of the photoactive layer 25 as the production source of electron-hole pairs remains as it is. Therefore, the photoelectric current produced inside the sensor is not lowered. As a result, the parasitic capacitance inside the sensor can be reduced without lowering the photoelectric current to be produced inside the sensor. It is, therefore, possible to more efficiently read the photoelectric current as a reception signal of the light sensor 15.

Third Embodiment

Figure 6:
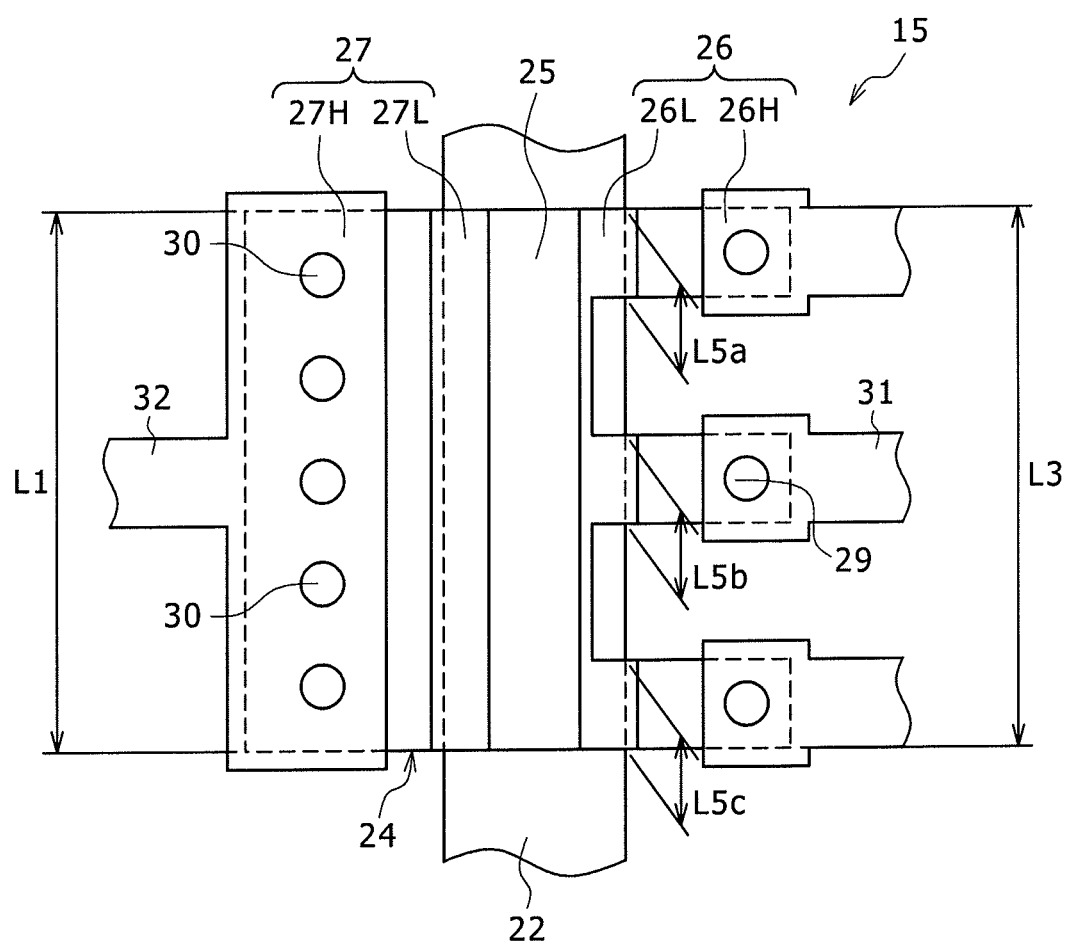
FIG. 6 is a plan view illustrating the construction of a light sensor according to a third embodiment of the present invention.

With reference to FIG. 6, the construction of a light sensor 15 according to the third embodiment of the present invention will next be described. In this third embodiment, the shape of a source region 26 is different from the above-described first embodiment. Specifically, the shape of the drain region 27 is rectangular and the shape of the source region 26 is trapezoid in the first embodiment, but in this third embodiment, a drain region 27 is formed in the shape of a rectangle and the source region 26 is formed in the shape of a comb. With respect to the drain region 27, the length of a low concentration region 27L, which overlaps the proximal side edge of a control electrode 22, and the length of a boundary portion between the low concentration region 27L and a photoactive layer 25 are, therefore, both set at the same length L1. As to the source region 26, on the other hand, the length L5 (L5=L5$a$+L5$b$+L5$c$) of a low concentration region 26L, which overlaps the proximal side edge of the control electrode 22, is shorter than the length L3 of the photoactive layer 25 in the direction along the proximal side edge of the control electrode 22 (the length of a boundary portion between a low concentration region 26L and the photoactive layer 25 in this embodiment).

Owing to the above-described construction, the mutually-facing area of the control electrode 22 and the source region 26 (low concentration region 26L) is smaller than that of the control electrode 22 and the drain region 27 (low concentration region 27L). Compared with the formation of the source region 26 in the shape of a similar rectangle as the drain region 27, the mutually-facing area of the control electrode 22 and the source region 26 is therefore smaller, and the parasitic capacitance inside the sensor is reduced correspondingly. As the longer dimension of the photoactive layer 25 remains at the same value (L1=L3) on both the source side and the drain side, the region (area) of the photoactive layer 25 as the production source of electron-hole pairs remains as it is. Therefore, the photoelectric current produced inside the sensor is not lowered. As a result, the parasitic capacitance inside the sensor can be reduced without lowering the photoelectric current to be produced inside the sensor. It is, therefore, possible to efficiently read the photoelectric current as a reception signal of the light sensor 15.

In the third embodiment, the mutually-facing area on the source side is made smaller than that on the drain side by forming the drain region 27 in the shape of the rectangle and the source region 26 in the shape of the comb. Conversely, the mutually-facing area on the drain side may be made smaller than that on the source side by forming the drain region 27 in the shape of a comb and the source region 26 in the shape of a rectangle. Further, the source region 26 and drain region 27 may each be formed in the shape of a comb.

Fourth Embodiment

Figure 7:
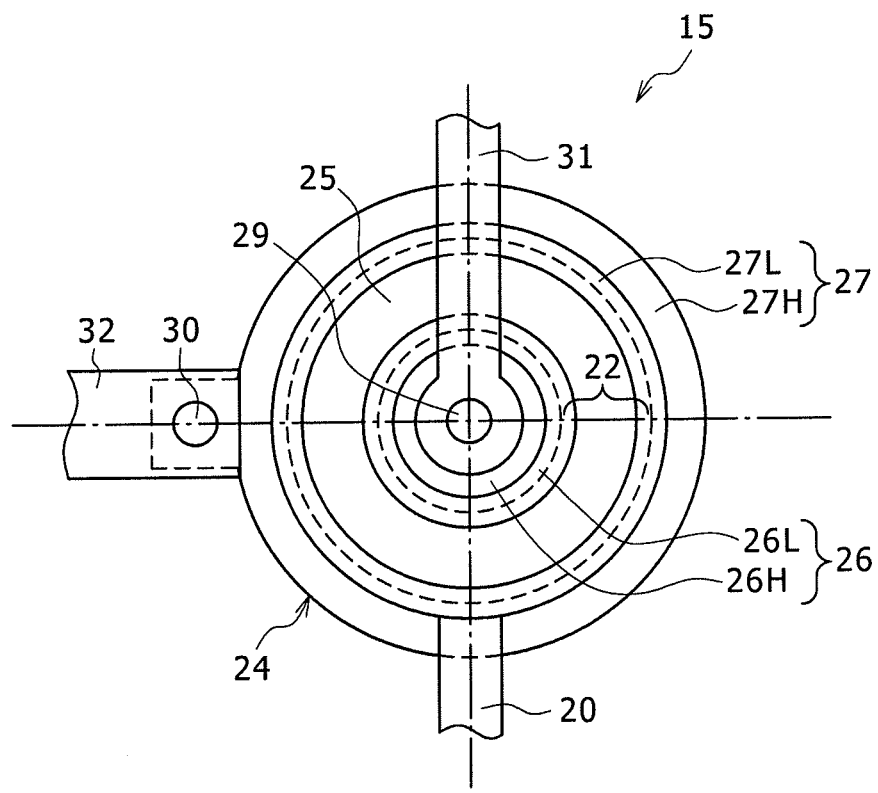
FIG. 7 is a plan view illustrating the construction of a light sensor according to a fourth embodiment of the present invention.
Figure 8:
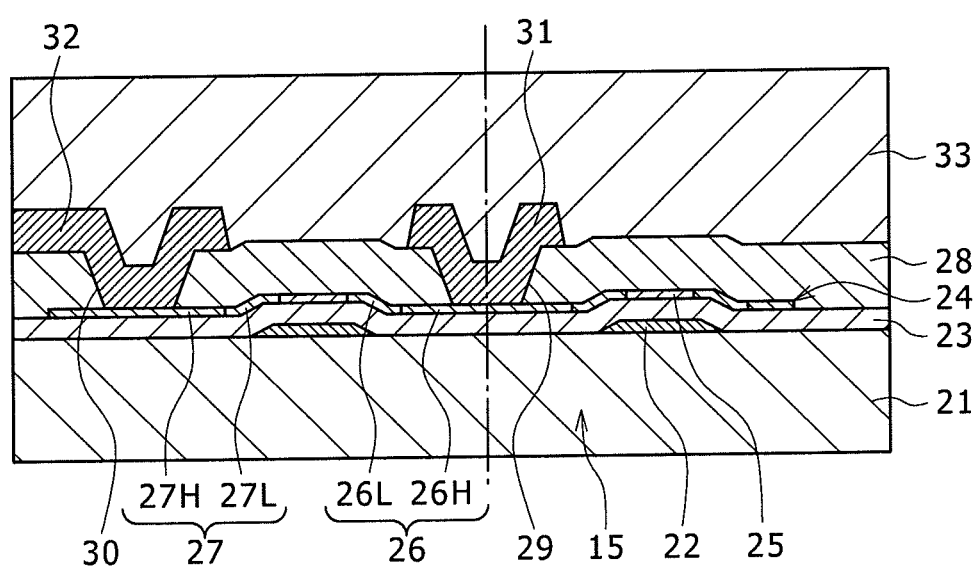
FIG. 8 is a cross-sectional view illustrating the construction of the light sensor according to the fourth embodiment of the present invention.

Referring next to FIGS. 7 and 8, the construction of a light sensor 15 according to the fourth embodiment of the present invention will be described. The fourth embodiment will be described by applying like reference signs to the elements of construction having like functions as the elements of construction described above in connection with the first to third embodiments. In the illustrated light sensor 15, a control electrode 22 and a source region 26, photoactive layer 25 and drain region 27 of a semiconductor film 24 are all arranged concentrically. The control electrode 22 is formed in an annular shape. To the control electrode 22, a control conductor 20 is connected. The semiconductor film 24 is formed in a circular (true round) shape. The semiconductor film 24 has the construction that the source region 26, photoactive layer 25 and drain region 27 are arranged in this order in a radial direction from the center of the light sensor 15. Therefore, the photoactive layer 25 is formed in an annular shape on an outer side of the circular source region 26 such that the photoactive layer 25 surrounds the source region 26, and the drain region 27 is formed in an annular shape on an outer side of the photoactive layer 25 such that the drain region 27 surrounds the photoactive layer 25.

The photoactive layer 25 is arranged in an area that overlaps the control electrode 22. The inner diameter of the photoactive layer 25 is set greater than the inner diameter of the control electrode 22, and the outer diameter of the photoactive layer 25 is set smaller than the outer diameter of the control electrode 22. The photoactive layer 25 is, therefore, arranged to be completely enclosed within the formation area of the control electrode 22.

The source region 26 is divided on an inner side thereof into a high concentration region 26H and on an outer side thereof into a low concentration region 26L, and an outer circumferential portion of the low concentration region 26L is located adjacent an inner circumferential portion of the photoactive layer 25. A contact hole 29 is arranged at a central position of the high concentration region 26H of the source region 26. The contact hole 29 is formed such that it extends through a second insulating film 28, and is filled with the conductor material of a first conductor 31. Right underneath the first conductor 31, the control electrode 22 and semiconductor film 24 may be cut off except for the source region 26 to prevent the photoactive layer 25, which corresponds to the channel of a MOS transistor, from being subjected to coupling by source signals.

The drain region 27 is divided on an outer side thereof into a high concentration region 27H and on an inner side thereof into a low concentration region 27L, and an inner circumferential portion of the low concentration region 27L is located adjacent an outer circumferential portion of the photoactive layer 25. A portion of the high concentration region 27H of the drain region 27 outwardly extends, and a contact hole 30 is formed in this extending portion. The contact hole 30 is formed such that it extends through the second insulating film 28, and is filled with the conductor material of a second conductor 32.

Now comparing the source region 26 of the semiconductor film 24 with the drain region 27 of the semiconductor film 24, the source region 26 is formed in the circular shape on the inner side of the photoactive layer 25 as opposed to the formation of the drain region 27 in the annular shape on the outer side of the photoactive layer 25. With respect to the drain region 27, the length (circumferential length) of the low concentration region 27L, which overlaps the proximal circumferential edge (outer circumferential edge) of the control electrode 22, is therefore longer than the length of the photoactive layer 25 in the direction along the proximal circumferential edge (circumferential direction) of the control electrode 22 (in this embodiment, the length (circumferential length) of a boundary portion between the low concentration region 27L and the photoactive layer 25). As to the source region 26, on the other hand, the length (circumferential length) of the low concentration region 26L, which overlaps the proximal circumferential edge (inner circumferential edge) of the control electrode 22, is shorter than the length of the photoactive layer 25 in the direction along the proximal circumferential edge (circumferential direction) of the control electrode 22 (in this embodiment, the length (circumferential length) of a boundary portion between the low concentration region 26L and the photoactive layer 25). The mutually-facing area of the control electrode 22 and the source region 26 (low concentration region 26L) is, therefore, smaller than that of the control electrode 22 and the drain region 27 (low concentration region 27). Assuming that the mutually-facing area of the control electrode 22 and the drain region 27 is the same as that in the above-described existing structure (in the case that the drain region is formed in the rectangular shape), the mutually-facing area of the control electrode 22 and source region 26 is smaller than that in the above-described existing structure, and the parasitic capacitance inside the sensor is decreased correspondingly.

Supposing that in a light sensor of the MOS transistor structure, an end portion of a photoactive layer on the side of a source region is a "source end" and an end of the photoactive layer on the side of a drain region is a "drain end," the drain end generally has a higher degree of contribution to the production of electron-hole pairs than the source end, because upon incidence of light into the photoactive layer, electron-hole pairs that produce a photoelectric current primarily occur at the drain end. In the light sensor 15 according to the fourth embodiment, the source region 26 and drain region 27 are arranged on an inner and outer sides, respectively, as the arrangement form of the semiconductor film 24. This assures to make longer the circumferential length of the drain end having a higher degree of contribution to the production of electron-hole pairs. Compared with the arrangement of the source region 26 on an outer side and the drain region 27 on an inner side, a higher photoelectric current can thus be produced. As a result, the parasitic capacitance inside the sensor can be reduced without lowering the photoelectric current to be produced inside the sensor. It is, therefore, possible to efficiently read the photoelectric current as a reception signal of the light sensor 15. Compared with existing sensors having the same sensor efficiency, the sensor according to this embodiment can be fabricated in smaller dimensions.

In the fourth embodiment, the shapes (inner circumferential shapes, outer circumferential shapes and the like) of the control electrode 22 and semiconductor film 24 are circles. It is, however, to be noted that these shapes are not limited to such circles but can be, for example, hexagons or any higher polygons.

The first to fourth embodiments were described by taking the light sensors of the n-channel MOS transistor structure as examples. It is, however, to be noted that the embodiment of the present invention is not limited to such light sensors but can also be applied to light sensors of the p-channel MOS transistor structure.

Further, the embodiment of the present invention is not limited to light sensors of the MOS transistor structure, but can also be applied to light sensors of the PIN diode structure. A PIN diode is constructed by using a semiconductor film which is divided into a p-type electrode region, an I-type photoactive layer and an n-type electrode region. In such a case, the paired electrode regions located on the opposite sides of the photoactive layer are formed by an anode region and a cathode region that make up the PIN diode. A description will hereinafter be made about certain specific embodiments in the case that the present invention is applied to light sensors of the PIN diode structure.

Fifth Embodiment

Figure 9:
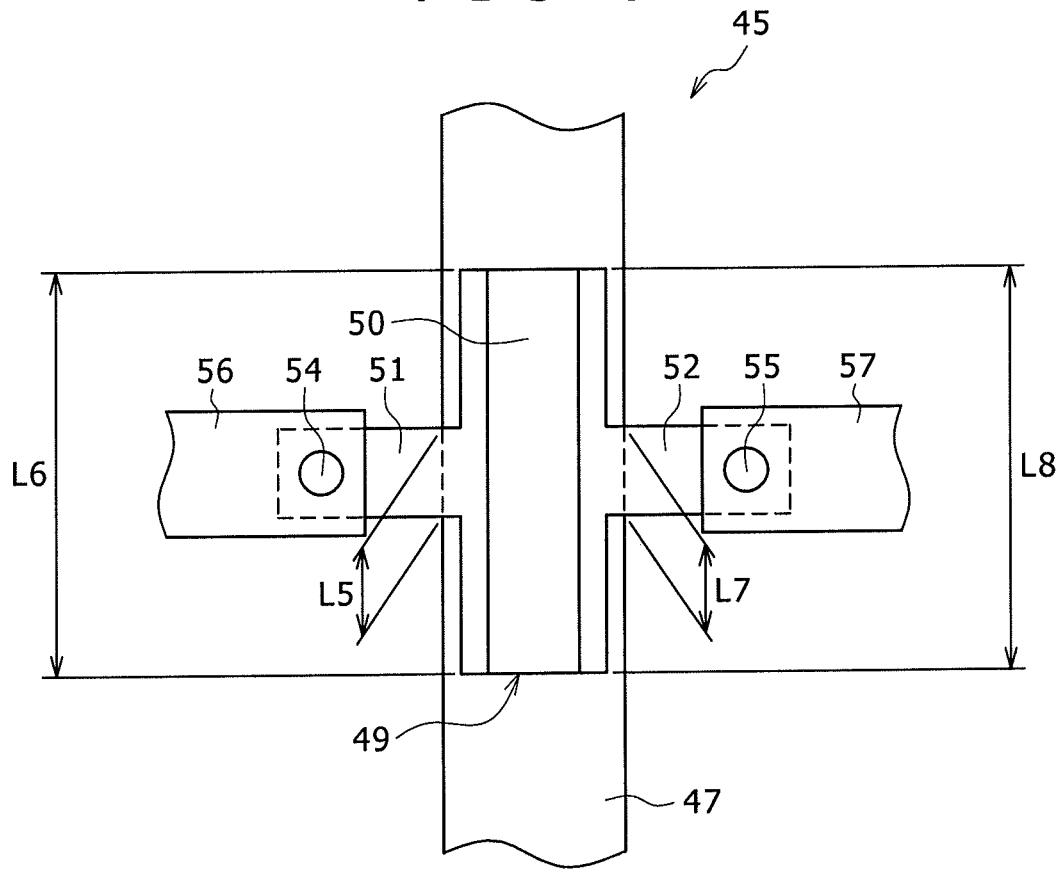
FIG. 9 is a plan view illustrating the construction of a light sensor according to a fifth embodiment of the present invention.
Figure 10:
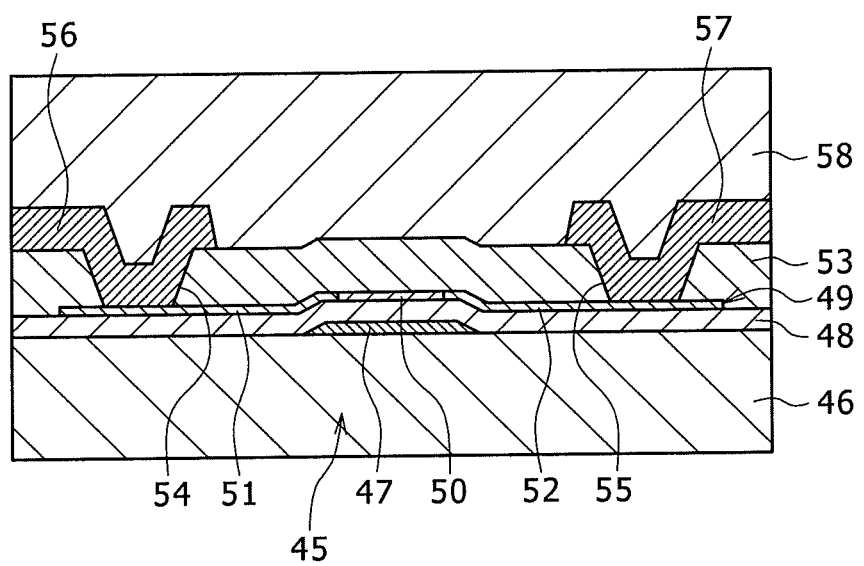
FIG. 10 is a cross-sectional view illustrating the construction of the light sensor according to the fifth embodiment of the present invention.

Referring to FIGS. 9 and 10, the construction of a light sensor 45 according to the fifth embodiment of the present invention will be described. The illustrated light sensor 45 has a similar structure as a PIN diode. In this light sensor 45, a control electrode 47 is formed like a strip on an upper surface of a substrate 46. Covering the control electrode 47, a first insulating film 48 is formed as a stacked layer. The substrate 46 is made up of a substrate having light-transmitting properties, specifically, for example, a transparent glass substrate. The control electrode 47 is formed on the common substrate 46 through the same steps as the gate electrode of the thin film transistor Tr (see FIG. 2) which serves as a pixel-driving, switching element. To the control electrode 47, a predetermined voltage is applied through an unillustrated control conductor to control the drive of the light sensor 45. The control electrode 47 is made up of a light-reflecting, conductive material such as, for example, molybdenum or a high melting-point metal. The first insulating film 48 is formed through the same steps as the gate insulating film of the above-described thin film transistor Tr.

The first insulating film 48 is made up of a light-transmitting, insulating material (for example, silicon oxide, silicon nitride or the like). For the formation of the first insulating film 48, CVD (Chemical Vapor Deposition) process can be employed. On an upper surface of the first insulating film 48, a semiconductor film 49 is formed. The semiconductor film 49 is a thin film made up, for example, of polycrystalline silicon, and is formed on the first insulating film 48 such that it extends over the control electrode 47 in the horizontal direction in the figures. The semiconductor film 49 can be formed, for example, by forming amorphous silicon on the first insulating film 48 and then irradiating an eximer laser to polycrystallize the silicon layer. The semiconductor film 49 constructs a PIN diode, and is divided into a photoactive layer 50 and a pair of electrode regions 51, 52. The photoactive layer 50 is of an I-type having a relatively low impurity concentration, while the paired electrode regions 51, 52 are of a P-type and N-type having relatively high impurity concentrations, respectively.

The photoactive layer 50 has photoelectric conversion function. The photoactive layer 50 produces electron-hole pairs as a source of a photoelectric current when light enters the photoactive layer 50. As viewed in a plan, the photoactive layer 50 takes the form of a rectangle which extends in the direction of the length of the control electrode 47. The photoactive layer 50 is arranged within an area that overlaps the control electrode 47. In the horizontal direction in the figures, the dimension of the photoactive layer 50 is set smaller than that of the control electrode 47, and in the direction of the vertical direction in the figures, the dimension of the photoactive layer 50 is also set smaller than that of the control electrode 47. The photoactive layer 50 is, therefore, arranged to be completely enclosed within the formation area of the control electrode 47.

The paired electrode regions 51, 52 are formed by introducing (implanting) impurities of different conductivity types into the semiconductor layer 49 on opposite sides of the photoactive layer 50, respectively, for example, while using an ion implantation system. One side is a P+ region, and the other side is an N+ region. Of the paired electrode regions 51, 52, one of them, that is, the electrode region (P+ region) 51 is arranged as an anode region, while the other electrode region (N+ region) 52 is arranged as a cathode region. The anode region 51 is arranged such that it extends over the proximal side edge of the control electrode 47 in the horizontal direction in the figures, and the cathode region 52 is arranged such that it extends over the proximal side edge of the control electrode 47 in the horizontal direction in the figures.

On the upper surface of the first insulating film 48, a second insulating film 53 is formed as a stacked layer such that the second insulating film 53 covers the semiconductor film 49. The second insulating film 53 is made up of a light transmitting, insulating material (for example, silicon oxide, silicon nitride or the like). For the formation of the second insulating film 53, CVD (Chemical Vapor Deposition) process can be employed. Through the second insulating film 53, a single contact hole 54 is formed to expose the anode region 51 at a part thereof, and further, another single contact hole 55 is formed to expose the cathode region 52 at a part thereof. The respective contact holes 54, 55 can be formed through the second insulating film 53, for example, by forming a resist pattern on the second insulating film 53 by a photolithographic technology and then etching the second insulating film 53 through the resist pattern. The anode-side contact hole 54 is filled with the conductor material of a first conductor 56, while the cathode-side contact hole 55 is filled with the conductor material of a second conductor 57. As the conductor materials of the first conductor 56 and second conductor 57, aluminum can be used, for example. On an upper surface of the second insulating film 53, a planarizing film 58 is formed as a stacked layer, covering the respective conductors 56, 57. The planarizing film 58 is made up of a light-transmitting, organic, insulating material.

It is to be noted that the anode region 51 and cathode region 52 of the semiconductor film 49 are each formed in a T-shape as viewed in a plan. With respect to the anode region 51, the length L5 of the anode region 51, which overlaps the proximal side edge of the control electrode 47, is shorter than the length L6 of the photoactive layer 50 in the direction along the proximal side edge of the control electrode 47 (the length of a boundary portion between the anode region 51 and the photoactive layer 50 in this embodiment). Similarly, as to the cathode region 52, the length L7 of the cathode region 52, which overlaps the proximal side edge of the control electrode 47, is shorter than the length L8 (L8=L6) of the photoactive layer 50 in the direction along the proximal side edge of the control electrode 47 (the length of a boundary portion between the cathode region 52 and the photoactive layer 50 in this embodiment).

In the light sensor 45 of the above-described construction, the incidence of light into the photoactive layer 50 in the semiconductor film 49 through the planarizing film 58, the second insulating film 53, etc. results in the production of electron-hole pairs in the photoactive layer 50 so that a photoelectric current is produced. This photoelectric current is read as a reception signal from the light sensor to the outside of the sensor.

Figure 11:
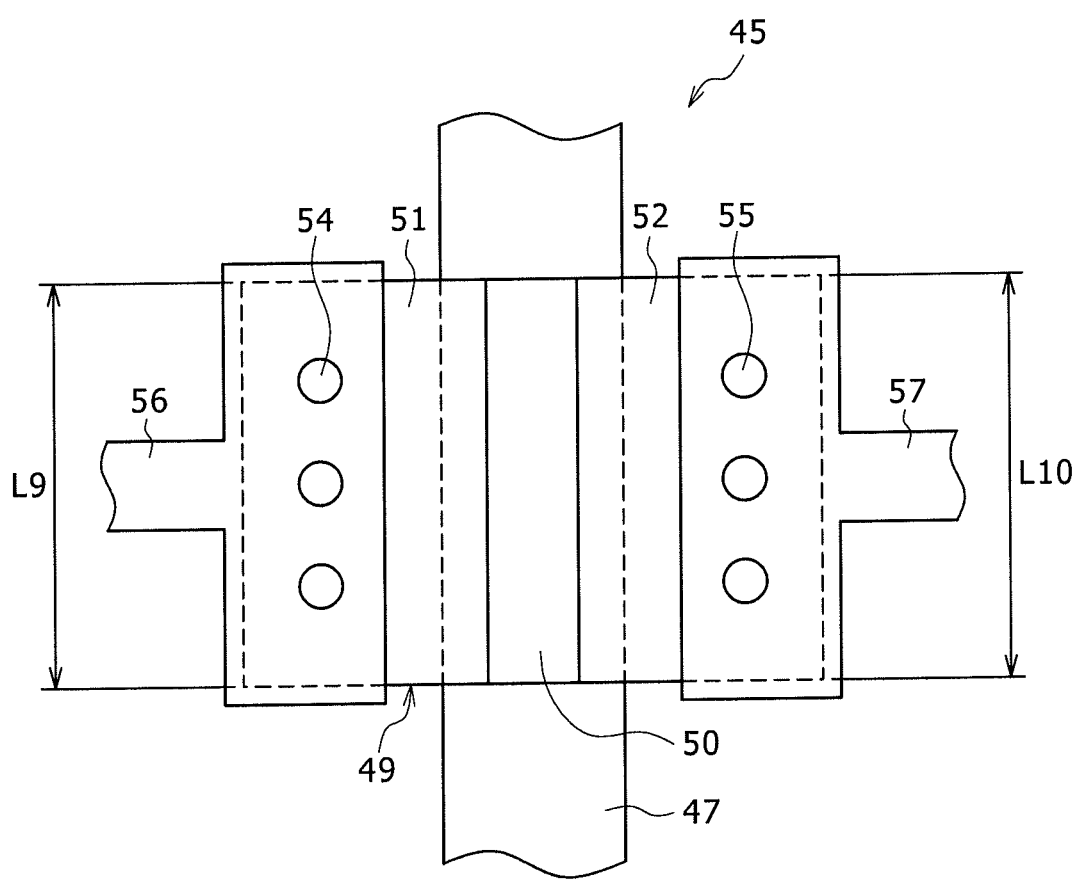
FIG. 11 is a plan view illustrating a comparative example to the present invention.

In the light sensor 45 according to the fifth embodiment of the present invention, by forming each of the anode region 51 and the cathode region 52 of the semiconductor film 49 in the T-shape, the length L5 of the anode region 51 which overlaps the proximal side edge of the control electrode 47 is made shorter than the length L6 of the photoactive layer 50 in the direction along the proximal side edge of the control electrode 47 (the length of the boundary portion between the anode region 51 and the photoactive layer 50 in this embodiment), and the length L7 of the cathode region 52 which overlaps the proximal side edge of the control electrode 47 is made shorter than the length L8 of the photoactive layer 50 in the direction along the proximal side edge of the control electrode 47 (the length of the boundary portion between the cathode region 52 and the photoactive layer 50 in this embodiment). When an anode region 51 and cathode region 52 of a semiconductor film 49 are each formed in a rectangular shape, for example, as illustrated in FIG. 11, on the other hand, the length L9 of the anode region 51, which overlaps the proximal side edge of the control electrode 47, becomes equal to the length L9 of a photoactive layer 50 in the direction along the proximal side edge of the control electrode 47 (the length of the boundary portion between the anode region 51 and the photoactive layer 50), and the length L10 of the cathode region 52, which overlaps the proximal side edge of the control electrode 47, becomes equal to the length L10 of the photoactive layer 50 in the direction along the proximal side edge of the control electrode 47 (the length of the boundary portion between the cathode region 52 and the photoactive layer 50).

Therefore, the mutually-facing area of the control electrode 47 and the anode region 51 is smaller compared with the case that the anode region 51 is formed in a rectangular shape, and the parasitic capacitance inside the sensor decreases correspondingly. Similarly, the mutually-facing area of the control electrode 47 and the cathode region 52 is smaller compared with the case that the cathode region 52 is formed in a rectangular shape, and the parasitic capacitance inside the sensor decreases correspondingly. As the longer dimension of the photoactive layer 50 remains at the same value (L6=L8=L9=L10) on both the anode region 51 and the cathode region 52, the region (area) of the photoactive layer 50 as the production source of electron-hole pairs remains as it is. Therefore, the photoelectric current produced inside the sensor is not lowered. As a result, the parasitic capacitance inside the sensor can be reduced without lowering the photoelectric current to be produced inside the sensor. It is, therefore, possible to efficiently read the photoelectric current as a reception signal of the light sensor 45.

Sixth Embodiment

Figure 12:
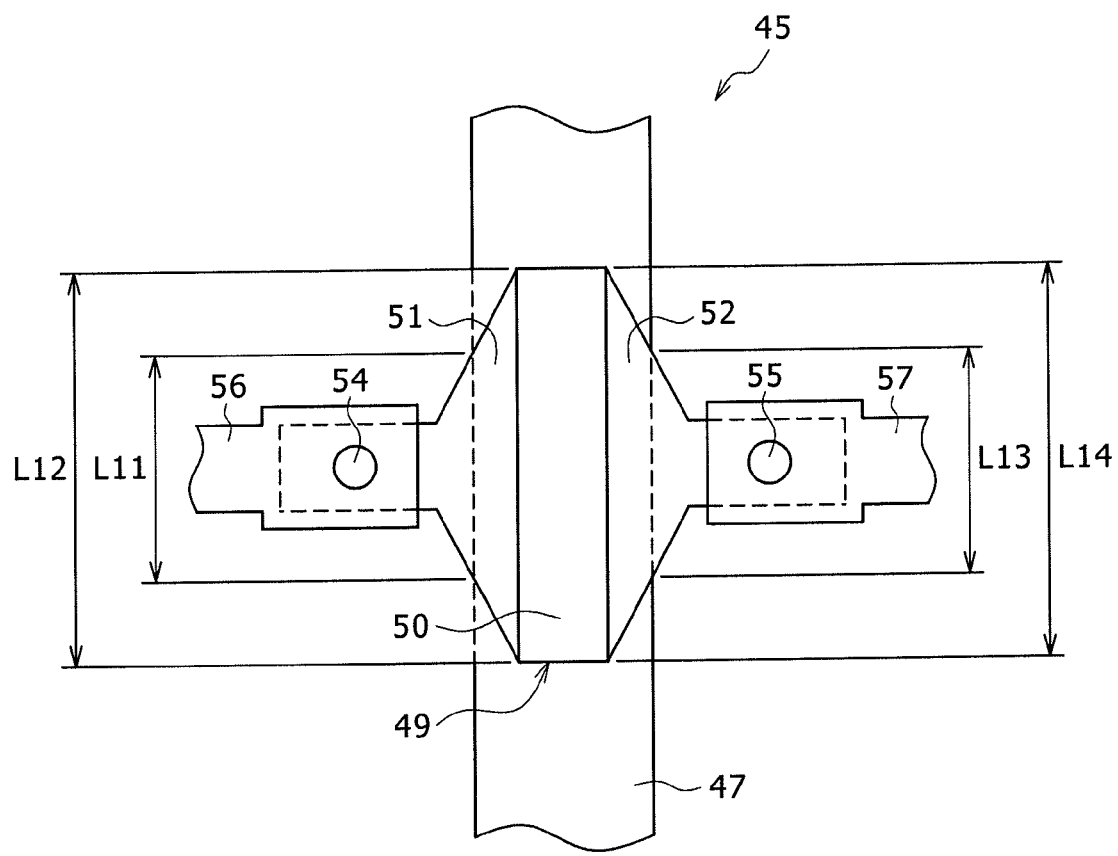
FIG. 12 is a plan view illustrating the construction of a light sensor according to a sixth embodiment of the present invention.

With reference to FIG. 12, the construction of a light sensor 45 according to the sixth embodiment of the present invention will next be described. In this sixth embodiment, the shapes of an anode region 51 and cathode region 52 are different from the above-described fifth embodiment. Specifically, the anode region 51 and cathode region 52 are each formed in the T-shape in the fifth embodiment, but in this sixth embodiment, the anode region 51 and cathode region 52 are each formed in the shape of a trapezoid terminating in a rectangular extension. Therefore, the length L11 of the anode region 51, which overlaps the proximal side edge of the control electrode 47, is shorter than the length L12 of a photoactive layer 50 in the direction along the proximal side edge of the control electrode 47 (the length of a boundary portion between the anode region 51 and the photoactive layer 50 in this embodiment), and the length L13 (L13=L11) of the cathode region 52, which overlaps the proximal side edge of the control electrode 47, is shorter than the length L14 (L14=L12) of the photoactive layer 50 in the direction along the proximal side edge of the control electrode 47 (the length of a boundary portion between the cathode region 52 and the photoactive layer 50 in this embodiment).

In the light sensor 45 of the above-described construction, by forming each of the anode region 51 and the cathode region 52 of the semiconductor 49 in the shape of the trapezoid terminating in the rectangular extension, the length L11 of the anode region 51 which overlaps the proximal side edge of the control electrode 47 is made shorter than the length L12 of the photoactive layer 50 in the direction along the proximal side edge of the control electrode 47 (the length of the boundary portion between the anode region 51 and the photoactive layer 50 in this embodiment), and the length L13 of the cathode region 52 which overlaps the proximal side edge of the control electrode 47 is made shorter than the length L14 of the photoactive layer 50 in the direction along the proximal side edge of the control electrode 47 (the length of the boundary portion between the cathode region 52 and the photoactive layer 50 in this embodiment). Compared with the case that the anode region 51 and cathode region 52 are each in a rectangular shape as illustrated in FIG. 11 described above, the mutually-facing area of the control electrode 47 and the anode region 51, therefore, becomes smaller so that the parasitic capacitance inside the sensor decreases correspondingly, and further, the mutually-facing area of the control electrode 47 and the cathode region 52 also becomes smaller so that the parasitic capacitance inside the sensor decreases correspondingly. As the longer dimension of the photoactive layer 50 remains at the same value (L9=L10=L12=L14) on both the anode side and the cathode side as that in the sensor structure shown in FIG. 11, the region (area) of the photoactive layer 50 as the production source of electron-hole pairs remains as it is. Therefore, the photoelectric current produced inside the sensor is not lowered. As a result, the parasitic capacitance inside the sensor can be reduced further without lowering the photoelectric current to be produced inside the sensor. It is, therefore, possible to efficiently read the photoelectric current as a reception signal of the light sensor 45.

Seventh Embodiment

Figure 13:
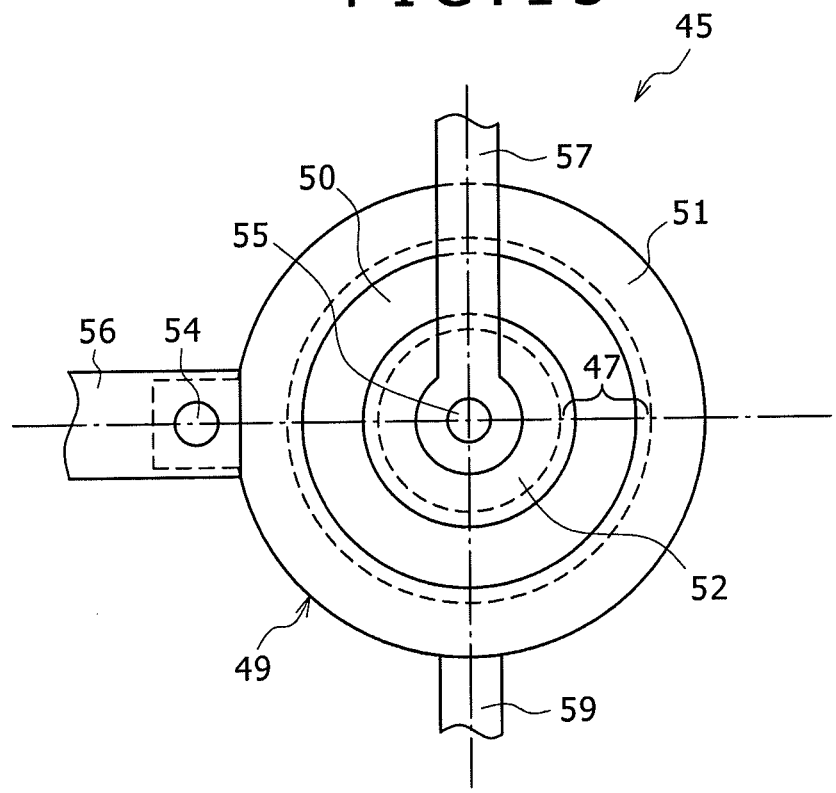
FIG. 13 is a plan view illustrating the construction of a light sensor according to a seventh embodiment of the present invention.
Figure 14:
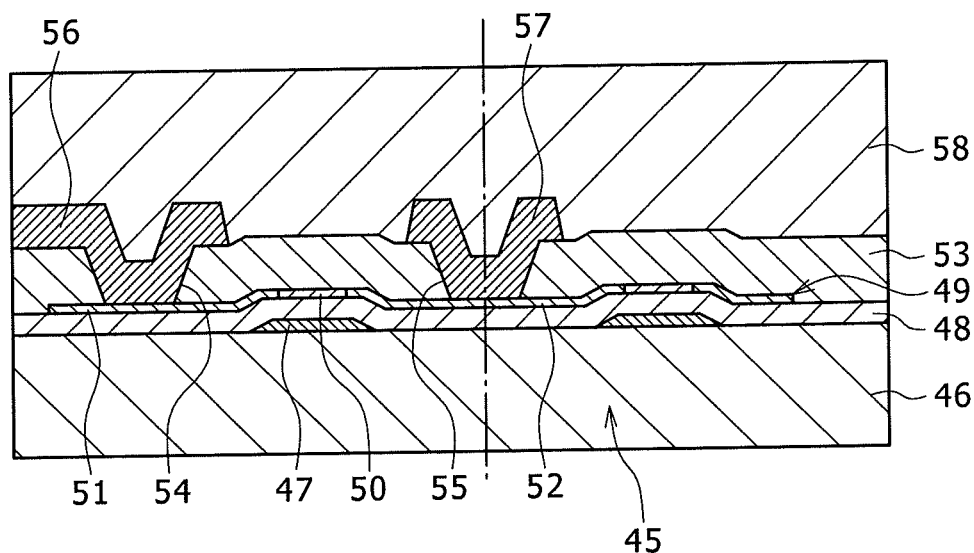
FIG. 14 is a cross-sectional view illustrating the construction of the light sensor according to the seventh embodiment of the present invention.

Referring next to FIGS. 13 and 14, the construction of a light sensor 45 according to the seventh embodiment of the present invention will be described. The seventh embodiment will be described by applying like reference signs to the elements of construction having like functions as the elements of construction described above in connection with the fifth and sixth embodiments. In the illustrated light sensor 45, a control electrode 47 and an anode region 51, photoactive layer 50 and cathode region 52 of a semiconductor film 49 are all arranged concentrically. The control electrode 47 is formed in an annular shape. To the control electrode 47, a control conductor 59 is connected. The semiconductor film 49 is formed in a circular (true round) shape. The semiconductor film 49 has the construction that the cathode region 52, photoactive layer 50 and anode region 51 are arranged in this order in a radial direction from the center of the light sensor 45. Therefore, the photoactive layer 50 is formed in an annular shape on an outer side of the circular cathode region 52 such that the photoactive layer 50 surrounds the cathode region 52, and the anode region 51 is formed in an annular shape on an outer side of the photoactive layer 50 such that the anode region 51 surrounds the photoactive layer 50.

The photoactive layer 50 is arranged in an area that overlaps the control electrode 47. The inner diameter of the photoactive layer 50 is set greater than the inner diameter of the control electrode 47, and the outer diameter of the photoactive layer 50 is set smaller than the outer diameter of the control electrode 47. The photoactive layer 50 is, therefore, arranged to be completely enclosed within the formation area of the control electrode 47.

An inner circumferential portion of the anode region 51 is located adjacent an outer circumferential portion of the photoactive layer 50. A portion of the anode region 51 outwardly extends, and a contact hole 54 is formed in this extending portion. The contact hole 54 is formed such that it extends through a second insulating film 53, and is filled with the conductor material of a first conductor (anode conductor) 56.

An outer circumferential portion of the cathode region 52 is located adjacent an inner circumferential portion of the photoactive layer 50. A contact hole 55 is arranged at a central position of the cathode region 52. The contact hole 55 is formed such that it extends through the second insulating film 53, and is filled with the conductor material of a second conductor (cathode conductor) 57.

Now comparing the anode region 51 of the semiconductor film 49 with the cathode region 52 of the semiconductor film 49, the cathode region 52 is formed in the circular shape on the inner side of the photoactive layer 50 as opposed to the formation of the anode region 51 in the annular shape on the outer side of the photoactive layer 50. The length (circumferential length) of the anode region 51, which overlaps the proximal circumferential edge (outer circumferential edge) of the control electrode 47, is therefore longer than the length of the photoactive layer 50 in the direction along the proximal circumferential edge (circumferential direction) of the control electrode 47 (in this embodiment, the length (circumferential lengths) of a boundary portion between the anode region 51 and the photoactive layer 50). On the other hand, the length (circumferential length) of the cathode region 52, which overlaps the proximal circumferential edge (inner circumferential edge) of the control electrode 47, is shorter than the length of the photoactive layer 50 in the direction along the proximal circumferential edge of the control electrode 47 (in this embodiment, the length (circumferential length) of a boundary portion between the cathode region 52 and the photoactive layer 50). The mutually-facing area of the control electrode 47 and the cathode region 52 is, therefore, smaller than that of the control electrode 47 and the anode region 51. Assuming that the mutually-facing area of the control electrode 47 and the anode region 51 is the same as that in the case that the anode region 51 and cathode region 52 are each formed in a rectangular shape, for example, as illustrated in FIG. 11 described above, the mutually-facing area of the control electrode 47 and cathode region 52 is smaller than that in the above-described sensor structure shown in FIG. 11, and the parasitic capacitance inside the sensor is decreased correspondingly.

Supposing that in a light sensor of the PIN diode structure, an end portion of a photoactive layer on the side of an anode region is an "anode end" and an end of the photoactive layer on the side of a cathode region is a "cathode end," the anode end generally has a higher degree of contribution to the production of electron-hole pairs than the cathode end, because upon incidence of light into the photoactive layer, electron-hole pairs that produce a photoelectric current primarily occur at the anode end. In the light sensor 45 according to the seventh embodiment, the cathode region 52 and anode region 51 are arranged on an inner and outer sides, respectively, as the arrangement form of the semiconductor film 49. This assures to make longer the circumferential length of the anode end having a higher degree of contribution to the production of electron-hole pairs. Compared with the arrangement of the cathode 52 on an outer side and the anode region 51 on an inner side, a higher photoelectric current can thus be produced. As a result, the parasitic capacitance inside the sensor can be reduced without lowering the photoelectric current to be produced inside the sensor. It is, therefore, possible to efficiently read the photoelectric current as a reception signal of the light sensor 45. Owing to the construction that the cathode region 52 is surrounded by the photoactive layer 50 and anode region 51, it is possible le to avoid any bias in the distribution of an electric field of the photoactive layer 50. Compared with existing sensors having the same sensor efficiency, the sensor according to this embodiment can be fabricated in smaller dimensions.

In the above-described seventh embodiment, the shapes (inner circumferential shapes, outer circumferential shapes and the like) of the control electrode 47 and semiconductor film 49 are circles. It is, however, to be noted that these shapes are not limited to such circles but can be, for example, hexagons or any higher polygons.

Eighth Embodiment

Figure 15:
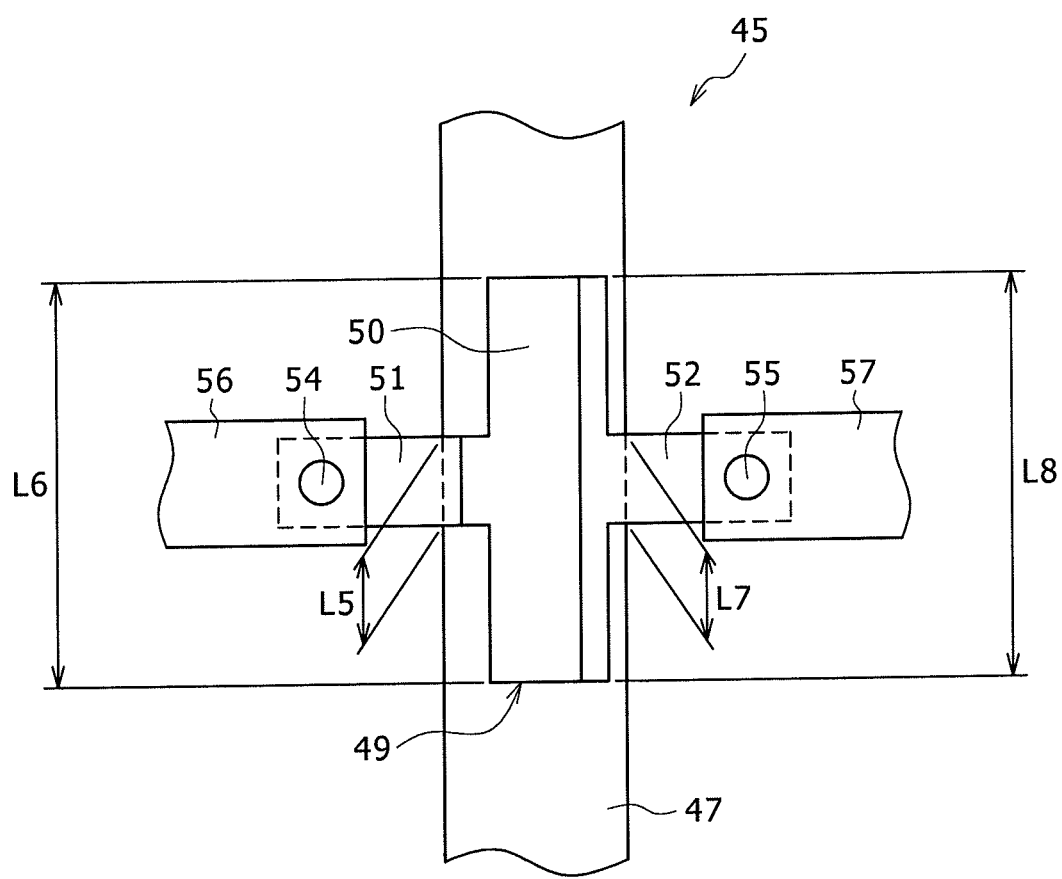
FIG. 15 is a plan view illustrating the construction of a light sensor according to an eighth embodiment of the present invention.

With reference to FIG. 15, the construction of a light sensor 45 according to the eighth embodiment of the present invention will next be described. In this eighth embodiment, the shapes of a photoactive layer 50 and an anode region 51 are different from the above-described fifth embodiment. Specifically, in the fifth embodiment, the photoactive layer 50 is formed in the strip-shape and the anode region 51 is formed in the T-shape, but in this eighth embodiment, a portion of the photoactive layer 50 is designed to extend with the same width as the anode region 51 toward the anode region 51. In a form continuing from the extending portion, the anode region 51 is formed in an I-shape, and a cathode region 52 is formed in a T-shape. Therefore, the length L5 of the anode region 51, which overlaps the proximal side edge of a control electrode 47, is shorter than the length L6 of the photoactive layer 50 in the direction along the proximal side edge of the control electrode 47. The length L7 of the cathode region 52, which overlaps the proximal side edge of the control electrode 47, is shorter than the length L8 of the photoactive layer 50 in the direction along the proximal side edge of the control electrode 47. It is, therefore, possible to obtain similar advantageous effects as the fifth embodiment. Compared with the fifth embodiment, the mutually-facing area of the control electrode 47 and the anode region 51 is smaller so that the parasitic capacitance inside the sensor is decreased correspondingly. The construction adopted in this eighth embodiment can be similarly applied to a light sensor of the above-mentioned n-channel MOS transistor structure. In such a case, the part of the anode region 51 becomes the part of a source region, and the part of the cathode region 52 becomes the part of a drain region. As a modification of the eighth embodiment, the anode region 51 may be formed in a T-shape and the cathode region 52 may be formed in an I-shape.

Ninth Embodiment

Figure 16:
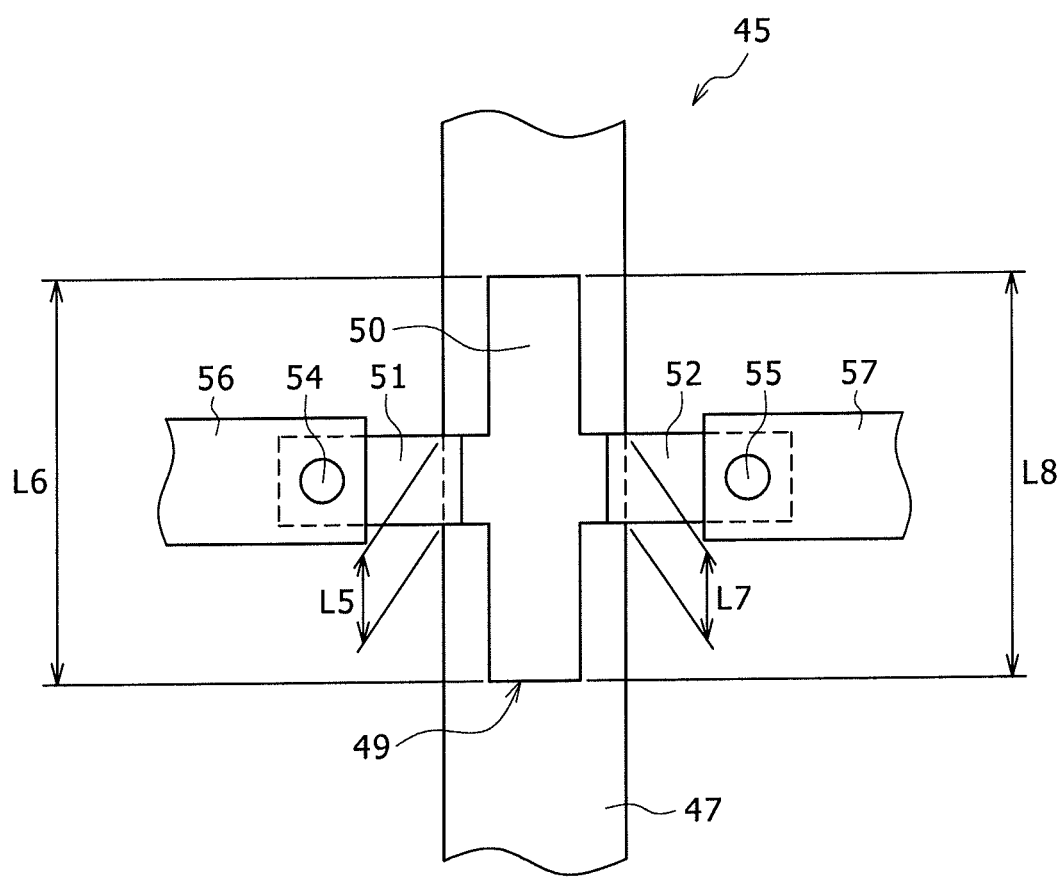
FIG. 16 is a plan view illustrating the construction of a light sensor according to a ninth embodiment of the present invention.

With reference to FIG. 16, the construction of a light sensor 45 according to the ninth embodiment of the present invention will next be described. In this ninth embodiment, the shapes of a photoactive layer 50 and a cathode region 52 are different from the above-described eighth embodiment. Specifically, in this ninth embodiment, a portion of the photoactive layer 50 is designed to extend with the same width as the cathode region 52 toward the cathode region 52. In a form continuing from the extending portion, the cathode region 52 is formed in an I-shape. Therefore, the length L5 of an anode region 51, which overlaps the proximal side edge of a control electrode 47, is shorter than the length L6 of the photoactive layer 50 in the direction along the proximal side edge of the control electrode 47. The length L7 of the cathode region 52, which overlaps the proximal side edge of the control electrode 47, is shorter than the length L8 of the photoactive layer 50 in the direction along the proximal side edge of the control electrode 47. It is, therefore, possible to obtain similar advantageous effects as the eighth embodiment. Compared with the fifth and eighth embodiments, the mutually-facing area of the control electrode 47 and the cathode region 52 is smaller so that the parasitic capacitance inside the sensor is decreased correspondingly. The construction adopted in this ninth embodiment can be similarly applied to a light sensor of the above-mentioned n-channel MOS transistor structure. In such a case, the part of the anode region 51 becomes the part of a source region, and the part of the cathode region 52 becomes the part of a drain region.

Tenth Embodiment

Figure 17:
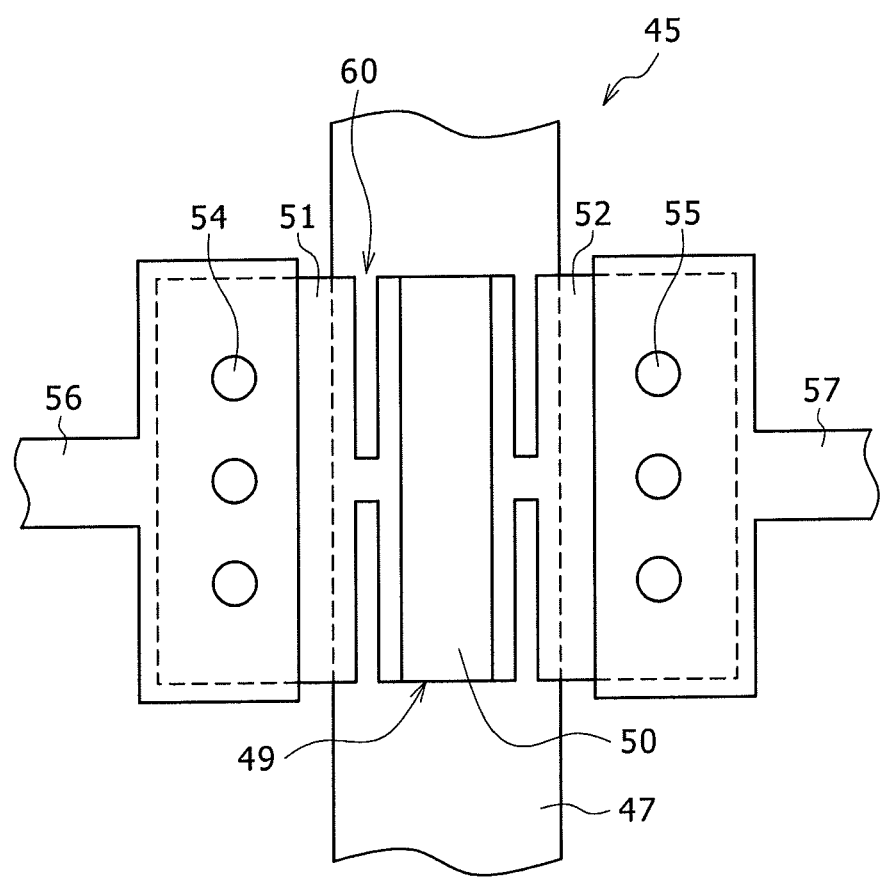
FIG. 17 is a plan view illustrating the construction of a light sensor according to a tenth embodiment of the present invention.

With reference to FIG. 17, the construction of a light sensor 45 according to the tenth embodiment of the present invention will next be described. In this tenth embodiment, the shapes of an anode region 51 and a cathode region 52 are different from the above-described PIN diode structure shown in FIG. 11 described above. Specifically, in the light sensor 45 of the PIN diode structure shown in FIG. 11, the anode region 51 and cathode region 52 of a semiconductor layer 49 are each formed in a rectangular shape. In this tenth embodiment, on the other hand, indentations 60 are formed in the anode region 51 at a part where the anode region 51 overlaps a control electrode 47, and further indentations are formed in the cathode region 52 at a part where the cathode region 52 overlaps the control electrode 47. The former indentations 60 are formed such that the width of the anode region 51 in the direction along the proximal side edge of the control electrode 47 (in the vertical direction of the figure) is locally narrowed. Similarly, the latter indentations 60 are formed such that the width of the cathode region 52 in the direction along the proximal side edge of the control electrode 47 (in the vertical direction of the figure) is locally narrowed.

In the light sensor 45 of the above-described construction, the mutually-facing area of the anode region 51 and the control electrode 47 is reduced owing to the arrangement of the indentations 60 in the anode region 51, and further, the mutually-facing area of the cathode region 52 and the control electrode 47 is reduced owing to the arrangement of the indentations 60 in the cathode region 52. Compared with the light sensor 45 of the PIN diode structure shown in FIG. 11, the parasitic capacitance inside the sensor is decreased. As the longer dimension of the photoactive layer 50 remains at the same value (L9=L10=L12=L14) on both the anode side and the cathode side as that in the sensor structure shown in FIG. 11, the region (area) of the photoactive layer 50 as the production source of electron-hole pairs remains as it is. Therefore, the photoelectric current produced inside the sensor is not lowered. As a result, the parasitic capacitance inside the sensor can be reduced further without lowering the photoelectric current to be produced inside the sensor. It is, therefore, possible to efficiently read the photoelectric current as a reception signal of the light sensor 45. In this embodiment, the indentations 60, 60 are arranged in both the anode region 51 and cathode region 52, respectively. Such indentations may, however, be arranged in only one of the anode region 51 and cathode region 52. Although not illustrated in a figure, at least one through-hole of a desired shape (for example, a circle, ellipse, polygon or the like) may be arranged in place of such indentation or indentations. The construction adopted in this tenth embodiment can be similarly applied to a light sensor of the above-mentioned n-channel MOS transistor structure. In such a case, the part of the anode region 51 becomes the part of a source region, and the part of the cathode region 52 becomes the part of a drain region.

Eleventh Embodiment

Figure 18:
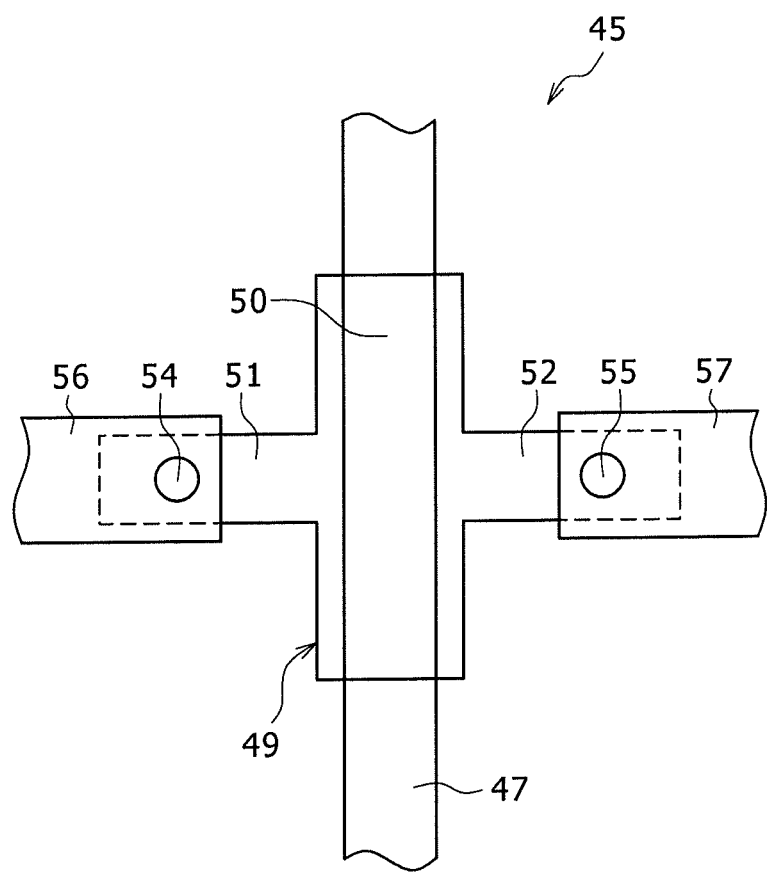
FIG. 18 is a plan view illustrating the construction of a light sensor according to an eleventh embodiment of the present invention.

With reference to FIG. 18, the construction of a light sensor 45 according to the eleventh embodiment of the present invention will next be described. In this eleventh embodiment, the layout relation between a control electrode 47 and a semiconductor film 49 is different from the above-described PIN diode structure shown in FIG. 9. Specifically, in the light sensor 45 of the PIN diode structure shown in FIG. 9, the photoactive layer 50 and parts the anode region 51 and cathode region 52 on the opposite sides of the photoactive layer 50 are arranged such that they overlap the control electrode 47. In this eleventh embodiment, however, only a photoactive layer 50 overlaps the control electrode 47, and neither an anode region 51 nor a cathode region 52 overlaps the control electrode 47. Described specifically, in a direction perpendicular to the direction along the proximal side edge of the control electrode 47 (in the horizontal direction of the figure), the dimensions (widths) of the control electrode 47 and photoactive layer 50 are the same. The boundary between the photoactive layer 50 and the anode region 51 is located on the same line as the proximal side edge of the control electrode 47, while the boundary between the photoactive layer 50 and the cathode region 52 is located on the same line as the proximal side edge of the control electrode 47.

In the light sensor 45 of the above-described construction, the mutually-facing area of the anode region 51 and control electrode 47 is substantially zero, and further, the mutually-facing area of the cathode region 52 and control electrode 47 is also substantially zero. Compared with the light sensor 45 of the PIN diode structure shown in FIG. 9, the parasitic capacitance inside the sensor is decreased. As the longer dimension of the photoactive layer 50 remains at an equivalent value as that in the sensor structure shown in FIG. 9, the region (area) of the photoactive layer 50 as the production source of electron-hole pairs remains as it is. Therefore, the photoelectric current produced inside the sensor is not lowered. As a result, the parasitic capacitance inside the sensor can be reduced further without lowering the photoelectric current to be produced inside the sensor. The construction adopted in this eleventh embodiment can be similarly applied to a light sensor of the above-mentioned n-channel MOS transistor structure. In such a case, the part of the anode region 51 becomes the part of a source region, and the part of the cathode region 52 becomes the part of a drain region.

APPLICATION EXAMPLES

The above-described display (liquid crystal display) 1 according to an embodiment of the present invention can be applied to electronic equipment in various fields which display, as a picture image or video image, video signals inputted in the electronic equipment or video signals generated in the electronic equipment, such as various electronic equipment depicted in FIGS. 19 to 23G, for example, digital cameras, notebook-size personal computers, mobile terminal equipment such as cellar phones, and video cameras.

First Application Example

Figure 19:
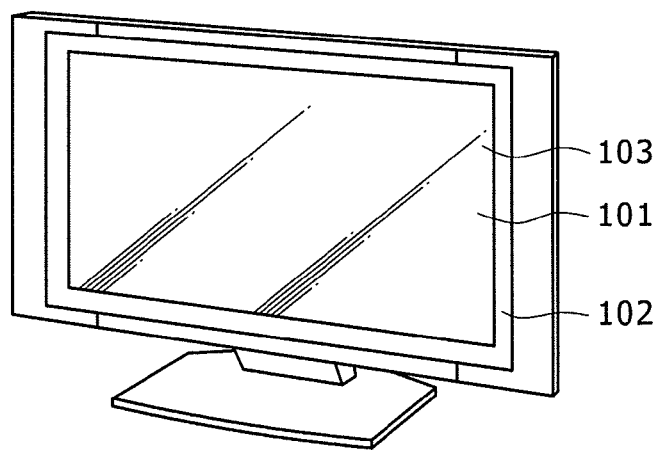
FIG. 19 is a perspective view illustrating a television set as a first application example.

FIG. 19 is a perspective view of a television set as a first application example. The television set according to this application example includes an image display screen 101 constructed of a front panel 102, a filter glass 103, etc., and the above-described display 1 can be applied as the image display screen 101.

Second Application Example

Figure 20A:
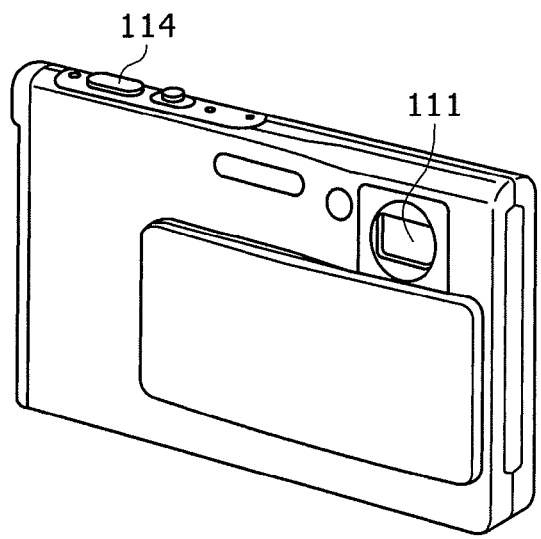
FIG. 20A is a perspective view illustrating a digital camera as a second application example as viewed from a front side.
Figure 20B:
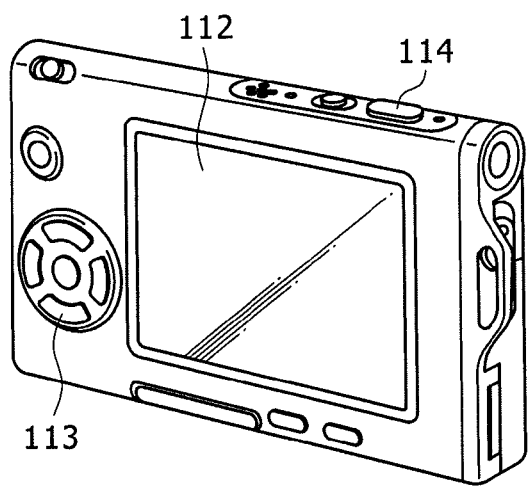
FIG. 20B is a perspective view of the digital camera as viewed from a back side.

FIGS. 20A and 20B are perspective views of a digital camera as a second application example. FIG. 20A is a perspective view as viewed from the front side, while FIG. 20B is a perspective view as viewed from the back side. The digital camera according to this application example includes a light-emitting unit 111 for flash light, a display 112, a menu selector 113, a shutter button 114, etc., and the above-described display 1 can be applied as the display 112.

Third Application Example

Figure 21:
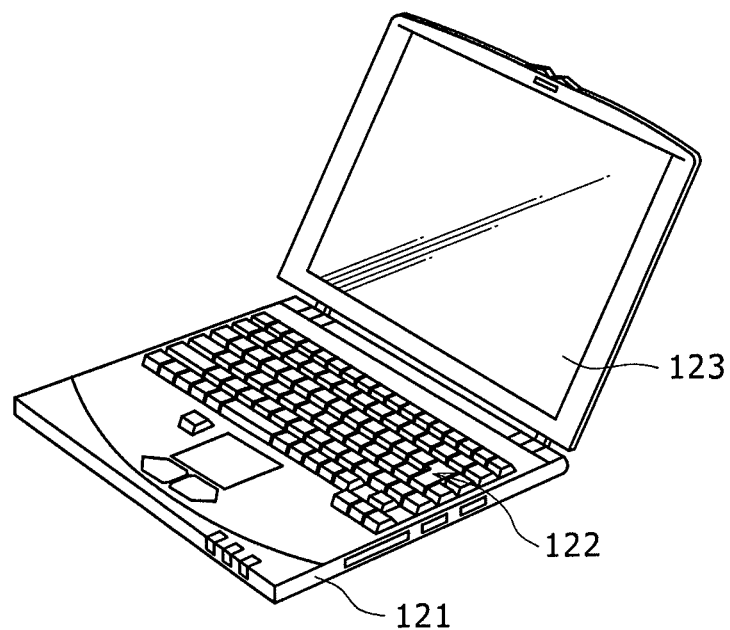
FIG. 21 is a perspective view depicting a notebook-size personal computer as a third application example.

FIG. 21 is a perspective view showing a notebook-size personal computer as a third application example. The notebook-size personal computer according to this application example includes a main body 121, a keyboard 122 to be operated upon inputting characters and the like, a display 123 for displaying images, etc., and the above-described display 1 can be applied as the display 123.

Fourth Application Example

Figure 22:
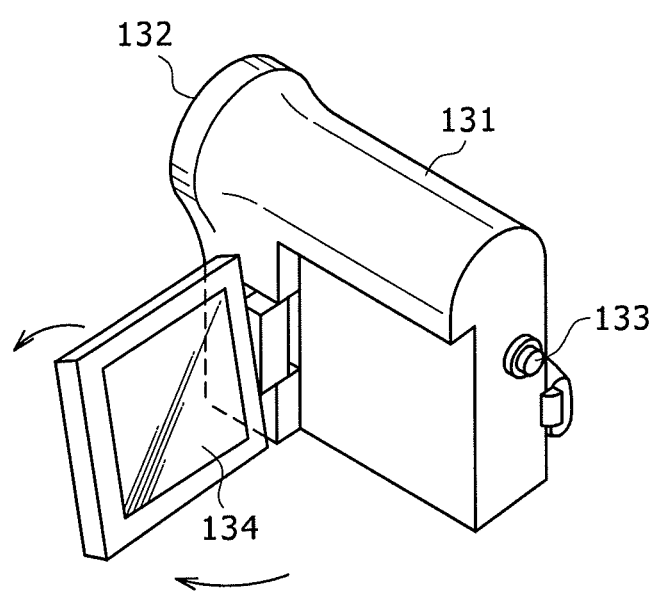
FIG. 22 is a perspective view depicting a video camera as a fourth application example.
Figure 24:
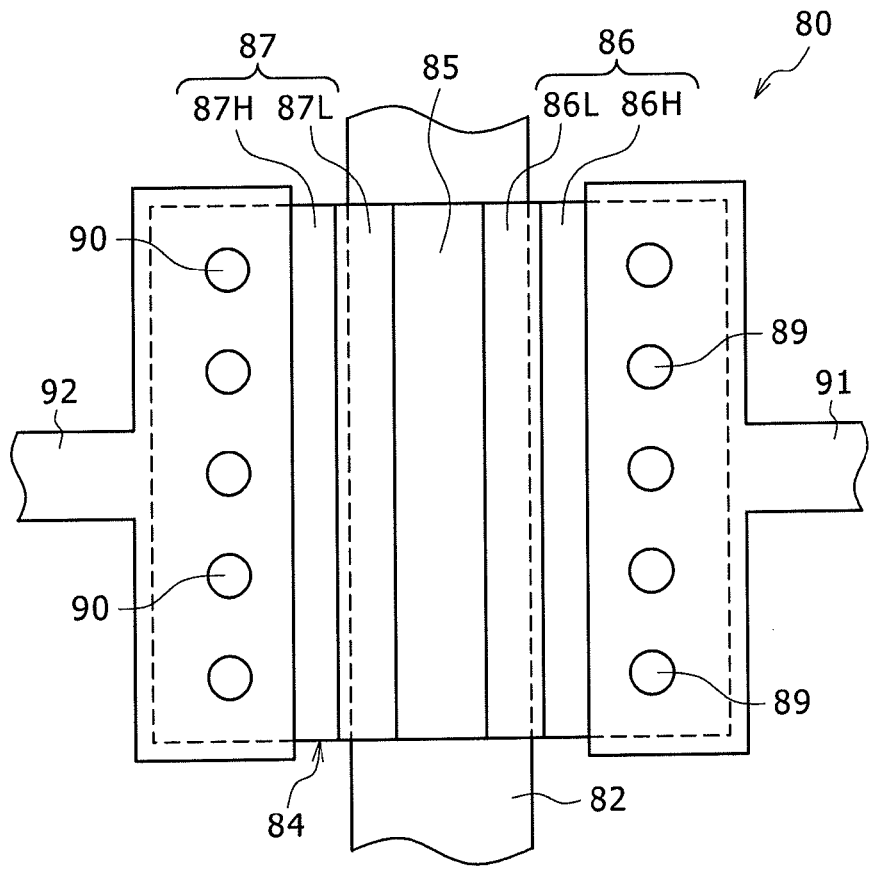
FIG. 24 is a plan view illustrating the construction of an existing light sensor.
Figure 25:
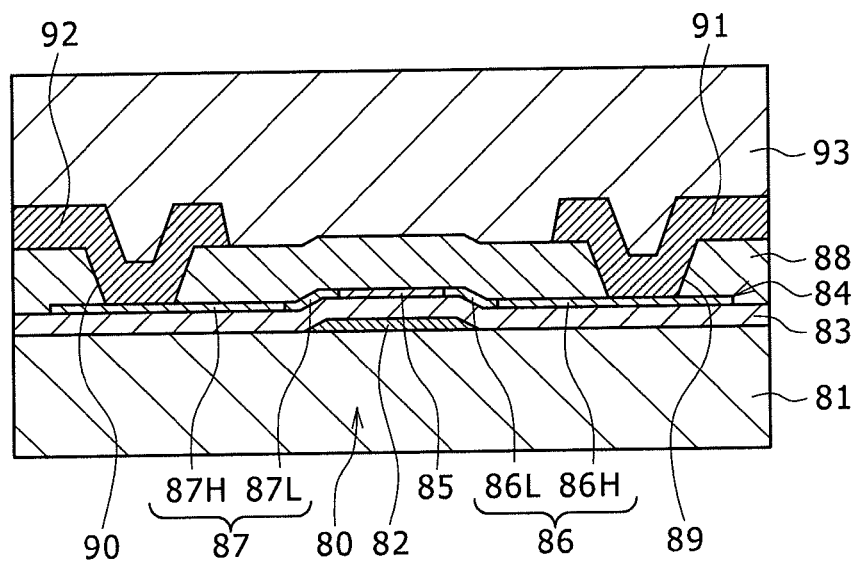
FIG. 25 is a cross-sectional view illustrating the construction of the existing light sensor.

FIG. 22 is a perspective view showing a video camera as a fourth application example. The video camera according to this application example includes a main body 131, an object-shooting lens 132 in a front side, a start/stop switch 133 to be employed upon shooting, a display 134, etc., and the above-described display 1 can be applied as the display 134.

Fifth Application Example

FIGS. 23A through 23G illustrate a mobile terminal equipment, specifically a cellar phone as a fifth application example, in which FIG. 23A is its front view in an opened state, FIG. 23B is its side view, FIG. 23C is its front view in a closed state, FIG. 23D is its left side view, FIG. 23E is its right side view, FIG. 23F is its top view, and FIG. 23G is its bottom view. The cellular phone according to this application example includes an upper casing 141, a lower casing 142, a connecting portion (hinge in this example) 143, a display 144, a sub-display 145, a picture light 146, a camera 147, etc., and the above-described display 1 can be applied as the display 145.

It should be understood by those skilled in the art that various modifications, combinations, sub-combinations and alterations may occur depending on design requirements and other factor in so far as they are within the scope of the appended claims or the equivalents thereof.

What is claimed is:

1. A light sensor comprising:
 a control electrode formed on a substrate and having two edges at opposite sides thereof; and
 a semiconductor film formed over said control electrode with an insulating film interposed therebetween, and including a photoactive layer and electrode regions located in a pair on opposite sides of said photoactive layer extending away from the edges of the control electrode in opposite directions; wherein
 said photoactive layer is arranged such that it overlaps said control electrode; and
 at least one of said paired electrode regions is a portion of the semiconductor film that extends such that a low concentration region overlaps a proximal side of the control electrode and being shorter than a length of the photoactive layer along the proximal side edge of the control electrode.

2. The light sensor according to claim 1, wherein said paired electrode regions comprise
 a source region and a drain region that constitute a MOS (metal oxide semiconductor) transistor.

3. The light sensor according to claim 1, wherein said paired electrode regions comprise
 an anode region and a cathode region that constitute a PIN (p-intrinsic-n) diode.

4. A display provided on a substrate with pixel elements and light sensors, wherein
 said light sensors each comprise:
 a control electrode formed on said substrate and having two edges; and
 a semiconductor film formed over said control electrode with an insulating film interposed therebetween, and including a photoactive layer and electrode regions located in a pair extending from opposite sides of said photoactive layer;
 said photoactive layer is arranged such that it overlaps said control electrode; and
 at least one of said paired electrode regions is a portion of the semiconductor film that extends such that a low concentration region overlaps a proximal side of the control electrode and being shorter than a length of the photoactive layer along the proximal side edge of the control electrode.

5. A display provided on a substrate with pixel elements and light sensors, wherein
 said light sensors each comprise:
 a control electrode formed on said substrate and having two edges; and
 a semiconductor film formed over said control electrode with an insulating film interposed therebetween, and including a photoactive layer and electrode regions located in a pair on opposite sides of said photoactive layer; and
 at least one of said paired electrode regions is a portion of the semiconductor film that extends such that a low concentration region overlaps a proximal side of the control electrode and being shorter than a length of the photoactive layer along the proximal side edge of the control electrode.

* * * * *